(12) United States Patent
Brown Elliott

(10) Patent No.: US 6,903,754 B2
(45) Date of Patent: Jun. 7, 2005

(54) ARRANGEMENT OF COLOR PIXELS FOR FULL COLOR IMAGING DEVICES WITH SIMPLIFIED ADDRESSING

(75) Inventor: Candice Hellen Brown Elliott, Vallejo, CA (US)

(73) Assignee: Clairvoyante, Inc, Sebastopol, CA (US)

( * ) Notice: Subject to any disclaimer, the term of this patent is extended or adjusted under 35 U.S.C. 154(b) by 435 days.

(21) Appl. No.: 09/916,232

(22) Filed: Jul. 25, 2001

(65) Prior Publication Data

US 2002/0015110 A1 Feb. 7, 2002

Related U.S. Application Data

(63) Continuation-in-part of application No. 09/628,122, filed on Jul. 28, 2000.

(51) Int. Cl.[7] .................................................. G09G 5/02
(52) U.S. Cl. ......................... 345/694; 345/72; 345/589
(58) Field of Search ............................... 345/72, 83, 88, 345/589, 597, 598, 690–695

(56) References Cited

U.S. PATENT DOCUMENTS

| | | |
|---|---|---|
| 3,971,065 A | 7/1976 | Bayer ......................... 358/41 |
| 4,353,062 A | 10/1982 | Lorteije et al. |
| 4,593,978 A | 6/1986 | Mourey et al. |
| 4,642,619 A | 2/1987 | Togashi |
| 4,651,148 A | 3/1987 | Takeda et al. |
| 4,751,535 A | 6/1988 | Myers |
| 4,773,737 A | 9/1988 | Yokono et al. |
| 4,786,964 A | 11/1988 | Plummer et al. ............. 358/44 |
| 4,792,728 A | 12/1988 | Chang et al. |
| 4,800,375 A | 1/1989 | Silverstein et al. |
| 4,853,592 A | 8/1989 | Strathman |
| 4,874,986 A | 10/1989 | Menn et al. |
| 4,886,343 A | 12/1989 | Johnson ...................... 350/335 |
| 4,908,609 A | 3/1990 | Stroomer |
| 4,920,409 A | 4/1990 | Yamagishi ................... 358/56 |
| 4,965,565 A | 10/1990 | Noguchi |
| 4,966,441 A | 10/1990 | Conner |
| 4,967,264 A | 10/1990 | Parulski et al. ............... 358/44 |

(Continued)

FOREIGN PATENT DOCUMENTS

| | | |
|---|---|---|
| DE | 197 46 329 A1 | 3/1999 |
| DE | 299 09 537 U1 | 10/1999 |

(Continued)

OTHER PUBLICATIONS

C. Elliott, "Reducing Pixel Count Without Reducing Image Quality", Information Display, vol. 15, pp. 22–25, Dec. 1999.

(Continued)

*Primary Examiner*—Henry N. Tran
*Assistant Examiner*—Jean Lesperance

(57) ABSTRACT

An array and row and column line architecture for a display is disclosed. The array consists of a plurality of row and column positions and a plurality of three-color pixel elements. A three-color pixel element can comprise a blue emitter, a pair of red emitters, and a pair of green emitters. Several designs for the three-color pixel element are contemplated. The drive matrix consists of a plurality of row and column drivers to drive the individual emitters. The row drivers drive the red, green and blue emitters in each row. The red and green emitters in each column are driven by a single column driver. However, a single column driver can drive two column lines of blue emitters, a first column line and a second column line of the next nearest neighboring three-color pixel element. Methods of driving a three-color pixel element are also disclosed.

72 Claims, 19 Drawing Sheets

U.S. PATENT DOCUMENTS

| | | | |
|---|---|---|---|
| 5,006,840 A | 4/1991 | Hamada et al. | |
| 5,052,785 A | 10/1991 | Takimoto et al. | |
| 5,113,274 A | * 5/1992 | Takahashi et al. | 349/109 |
| 5,115,274 A | * 5/1992 | Shibazaki et al. | 399/197 |
| 5,132,674 A | 7/1992 | Bottorf | |
| 5,144,288 A | 9/1992 | Hamada et al. | |
| 5,184,114 A | 2/1993 | Brown | |
| 5,189,404 A | 2/1993 | Masimo et al. | |
| 5,233,385 A | 8/1993 | Sampsell | |
| 5,311,337 A | 5/1994 | McCartney, Jr. | |
| 5,315,418 A | 5/1994 | Sprague et al. | 359/41 |
| 5,334,996 A | 8/1994 | Tanigaki et al. | 345/152 |
| 5,341,153 A | 8/1994 | Benzschawel et al. | 345/152 |
| 5,398,066 A | 3/1995 | Martinez-Uriegas et al. | 348/393 |
| 5,436,747 A | 7/1995 | Suzuki | |
| 5,461,503 A | 10/1995 | Deffontaines et al. | |
| 5,535,028 A | 7/1996 | Bae et al. | |
| 5,541,653 A | 7/1996 | Peters et al. | 348/264 |
| 5,561,460 A | 10/1996 | Katoh et al. | 348/219 |
| 5,563,621 A | 10/1996 | Silsby | |
| 5,579,027 A | 11/1996 | Sakurai et al. | |
| 5,646,702 A | 7/1997 | Akinwande et al. | |
| 5,648,793 A | 7/1997 | Chen | |
| 5,729,244 A | 3/1998 | Lockwood | |
| 5,754,226 A | 5/1998 | Yamada et al. | 348/219 |
| 5,792,579 A | 8/1998 | Phillips | |
| 5,815,101 A | 9/1998 | Fonte | |
| 5,821,913 A | 10/1998 | Mamiya | |
| 5,949,496 A | 9/1999 | Kim | |
| 5,973,664 A | 10/1999 | Badger | |
| 6,002,446 A | 12/1999 | Eglit | |
| 6,005,692 A | 12/1999 | Stahl | |
| 6,008,868 A | 12/1999 | Silverbrook | 348/790 |
| 6,034,666 A | 3/2000 | Kanai et al. | |
| 6,038,031 A | 3/2000 | Murphy | |
| 6,049,626 A | 4/2000 | Kim | |
| 6,061,533 A | 5/2000 | Kajiwara | |
| 6,064,363 A | 5/2000 | Kwon | |
| 6,097,367 A | * 8/2000 | Kuriwaki et al. | 345/589 |
| 6,108,122 A | 8/2000 | Ulrich et al. | |
| 6,144,352 A | * 11/2000 | Matsuda et al. | 345/83 |
| 6,147,664 A | 11/2000 | Hansen | |
| 6,151,001 A | 11/2000 | Anderson et al. | |
| 6,160,535 A | 12/2000 | Park | |
| 6,184,903 B1 | 2/2001 | Omori | |
| 6,188,385 B1 | 2/2001 | Hill et al. | 345/136 |
| 6,198,507 B1 | 3/2001 | Ishigami | |
| 6,219,025 B1 | 4/2001 | Hill et al. | |
| 6,225,967 B1 | 5/2001 | Hebiguchi | |
| 6,225,973 B1 | 5/2001 | Hill et al. | |
| 6,236,390 B1 | 5/2001 | Hitchcock | |
| 6,239,783 B1 | 5/2001 | Hill et al. | |
| 6,243,055 B1 | 6/2001 | Fergason | |
| 6,243,070 B1 | 6/2001 | Hill et al. | |
| 6,262,710 B1 | 7/2001 | Smith | |
| 6,271,891 B1 | 8/2001 | Ogawa et al. | |
| 6,299,329 B1 | 10/2001 | Mui et al. | |
| 6,327,008 B1 | 12/2001 | Fujiyoshi | |
| 6,346,972 B1 | 2/2002 | Kim | |
| 6,360,023 B1 | 3/2002 | Betrisey et al. | |
| 6,377,262 B1 | 4/2002 | Hitchcock et al. | |
| 6,392,717 B1 | 5/2002 | Kunzman | |
| 6,393,145 B2 | 5/2002 | Betrisey et al. | |
| 6,441,867 B1 | 8/2002 | Daly | |
| 6,453,067 B1 | 9/2002 | Morgan et al. | |
| 6,466,618 B1 | 10/2002 | Messing et al. | |
| 6,600,495 B1 | 7/2003 | Boland et al. | |
| 6,628,068 B1 | 9/2003 | Rorison et al. | |
| 6,661,429 B1 | 12/2003 | Phan | |
| 6,738,526 B1 | 5/2004 | Betrisey et al. | |
| 2001/0017515 A1 | 8/2001 | Kusonoki et al. | |
| 2001/0040645 A1 | 11/2001 | Yamazaki | |
| 2002/0012071 A1 | 1/2002 | Sun | |
| 2002/0015110 A1 | 2/2002 | Brown | |
| 2002/0017645 A1 | 2/2002 | Yamazaki et al. | |
| 2002/0122160 A1 | 9/2002 | Kunzman | |
| 2002/0140831 A1 | 10/2002 | Hayashi | |
| 2002/0190648 A1 | 12/2002 | Bechtel et al. | |
| 2003/0011613 A1 | 1/2003 | Booth, Jr. | |
| 2003/0043567 A1 | 3/2003 | Hoelen et al. | |
| 2003/0071826 A1 | 4/2003 | Goertzen | |
| 2003/0071943 A1 | 4/2003 | Choo | |
| 2003/0218618 A1 | 11/2003 | Phan | |

FOREIGN PATENT DOCUMENTS

| | | |
|---|---|---|
| DE | 199 23 527 A1 | 11/2000 |
| DE | 199-23-527 | * 11/2000 |
| DE | 201 09 354 U1 | 9/2001 |
| EP | 0 158 366 A2 | 10/1985 |
| EP | 0 203 005 A1 | 11/1986 |
| EP | 0 322 108 A2 | 6/1989 |
| EP | 0 793 214 A1 | 9/1997 |
| EP | 0 812 114 A1 | 12/1997 |
| EP | 0 899 604 A2 | 3/1999 |
| EP | 899 604 A2 | 3/1999 |
| EP | 1 083 539 A2 | 3/2001 |
| EP | 1 261 014 A2 | 11/2002 |
| EP | 1 381 020 A2 | 1/2004 |
| GB | 2 133 912 A | 8/1984 |
| GB | 2 146 478 A | 4/1985 |
| JP | 60-107022 | 6/1985 |
| JP | 02-000826 A | 1/1990 |
| JP | 03-78390 | 4/1991 |
| JP | 03-036239 B | 5/1991 |
| JP | 06-102503 | 4/1994 |
| JP | 02-983027 B2 | 11/1999 |
| JP | 2001203919 | 7/2001 |
| WO | WO 97/23860 | 7/1997 |
| WO | WO 00/21067 | 4/2000 |
| WO | WO 00/65432 | 11/2000 |
| WO | WO 00/67196 | 11/2000 |
| WO | WO 01/29817 A1 | 4/2001 |
| WO | WO 03/014819 A1 | 2/2003 |

OTHER PUBLICATIONS

C. Elliott, "Active Matrix Display Layout Optimization For Sub–Pixel Image Rendering", IDMC 2000, pp. 185–189, Aug. 2000.

Krantz, John et al., Color Matrix Display Image Quality: The Effects of Luminance and Spatial Sampling, SID 90 Digest, pp 29–32.

Lee, Baek–woon et al., "40.5L: Late–News Paper: TFT–LCD with RGBW Color System," SID 03 Digest, 2003, pp. 1212–1215.

Messing, Dean et al., Improved Display Resolution of Subsampled Colour Images Using Subpixel Addressing, IEEE ICIP 2002.

Messing, Dean et al., Subpixel Rendering on Non–Striped Colour Mtrix Displays, 2003 International Conf on Image Processing, Sep. 2003, Barcelona, Spain .

H. Okamura, "A New Flicker–Reduction Drive Method for High–Resolution LCTV's", SID 01 Digest, pp. 551–554, 2001 (no month).

"Detectability of Reduced Blue Pixel Count in Projection Displays" R. Martin et al.

"A New Flicker–Reduction Drive Method for High–Resolution LCTVs" Okumura et al., pp. 551–554.

R. Martin et al., "Detectability of reduced blue pixel count in projection displays", Proceedings of the Society for Information Display Symposium Digest, pp. 606–609, May 1993.

Adobe Systems, Inc., website, 2002, http://www.adobe.com/products/acrobat/cooltype.html.

Betrlsey, C., et al., "Displaced Filtering for Patterned Displays," 2000, *Society for Information Display (SID) 00 Digest*, pp. 296–299.

Carvajal, D., "Big Publishers Looking into Digital Books," Apr. 3, 2000, *The New York Times*, Business/Financial Desk.

Elliott, C., "New Pixel Layout for Pen Tile Matrix," Jan. 2002, Proceedings of the International Display Manufacturing Conference, pp. 115–117.

Gibson Research Corporation, website, "Sub–Pixel Font Rendering Technology, How it Works," 2002, http://www.grc.com/ctwhat.html.

Microsoft Corporation, website, 2002, http://www.microsoft.com/reader/ppc/product/cleartype.html.

Microsoft Press Release, Nov. 15, 1998, Microsoft Research Announces Screen Display Breakthrough at COMDEX/Fall '98, PR Newswire.

Murch, M., "Visual Perception Basics," 1987, *SID*, Seminar 2, Tektronlx, Inc., Beaverton, Oregon.

Wandell, Brian A., Stanford University, "Fundamentals of Vision: Behavior, Neuroscience and Computation," Jun. 12, 1994, *Society for Information Display (SID) Short Course S–2*. Fairmont Hotel, San Jose, California.

"ClearType magnified," *Wired Magazine*, Nov. 8, 1999, Microsoft Typography, article posted Nov. 8, 1999, and last updated Jan. 27, 1999, © Microsoft Corporation, 1 page.

Credelle, Thomas L. et al., "P–00: MTF of High–Resolution PenTile Matrix™ Displays," *Eurodisplay 02 Digest*, 2002, pp. 1–4.

Daly, Scott, "Analysis of Subtriad Addressing Algorithms by Visual System Models," *SID Symp. Digest*, Jun. 2001, pp. 1200–1203.

Elliott, Candice H. Brown et al., "Color Subpixel Rendering Projectors and Flat Panel Displays," New Initiatives in Motion Imaging, SMPTE Advanced Motion Imaging Conference, Feb. 27–Mar. 1, 2003, Seattle, Washington, pp. 1–4.

Elliott, Candice H. Brown et al., "Co–optimization of Color AMLCD Subpixel Architecture and Rendering Algorithms," *SID Symp. Digest*, May 2002, pp. 172–175.

Feigenblatt, R.I., "Full–color Imaging on amplitude–quantized color mosaic displays," *SPIE*, vol. 1075, Digital Image Processing Applications, 1989, pp. 199–204.

Johnston, Stuart J., "An Easy Read: Microsoft's ClearType," *InformationWeek Online*, Redmond, WA, Nov. 23, 1998, 3 pages.

Johnston, Stuart J., "Clarifying ClearType," *InformationWeek Online*, Redmond, WA, Jan. 4, 1999, 4 pages.

"Just Outta Beta," *Wired Magazine*, Dec. 1999, Issue 7.12, 3 pages.

Klompenhouwer, Michiel A. et al., "Subpixel Image Scaling for Color Matrix Displays," *SID Symp. Digest*, May 2002, pp. 176–179.

Markoff, John, "Microsoft's Cleartype Sets Off Debate on Originality," *The New York Times*, Dec. 7, 1998, 5 pages.

"Microsoft ClearType", http://www.microsoft.com/opentype/cleartype, Sep. 26, 2002, 4 pages.

Platt, John C., "Optimal Filtering for Patterned Diplays," Microsoft Research, *IEEE Signal Processing Letters*, 2000, 4 pages.

Platt, John, "Technical Overview of ClearType Filtering," Microsoft Research, http://research.microsoft.com/users/platt/cleartype/default.aspx, Sep. 17, 2002, 3 pages.

Poor, Alfred, "LCDs: The 800–pound Gorilla," *Information Display*, Sep. 2002, pp. 18–21.

"Ron Feigenblatt's remarks on Microsoft ClearType™," http://www.geocities.com/SiliconValley/Ridge/6664/ClearType.html, Dec. 5, 1998, Dec. 7, 1998, Dec. 12, 1999, Dec. 26, 1999. Dec. 30, 1999, and Jun. 19, 2000, 30 pages.

"Sub–Pixel Font Rendering Technology," ©2003 Gibson Research Corporation, Laguna Hills, CA, 2 pages.

Werner, Ken, "OLEDs, OLEDs, Everywhere . . . ," *Information Display*, Sep. 2002, pp. 12–15.

Krantz, John H. et al., "Color Matrix Display Image Quality; The Effects of Luminescence and Spatial Sampling", *SID International Symposium, Digest of Technical Papers*, 1990, pp. 29–32.

Messing, Dean S. et al., "Improved Display Resolution of Subsampled Colour Images Using Subpixel Addressing," *Proc. Int. Conf. Image Processing (ICIP '02)*, Rochester, N.Y., IEEE Signal Processing Society, 2002, vol. 1, pp. 625–628.

Messing, Dean S. et al., "Subpixel Rendering on Non–Striped Colour Matrix Displays," *International Conference on Image Processing*, Barcelona, Spain, Sep. 2003, 4 pages.

* cited by examiner

ARRANGEMENT OF COLOR PIXELS FOR FULL COLOR IMAGING DEVICES WITH SIMPLIFIED ADDRESSING

CROSS-REFERENCE TO RELATED APPLICATION

The present application is a continuation-in-part to U.S. patent application Ser. No. 09/628,122, entitled "Arrangement of Color Pixels for Full Color Imaging Devices with Simplified Addressing", filed on Jul. 28, 2000.

BACKGROUND

The present application relates to color pixel arrangements, and specifically to color pixel arrangements used in electronic imaging devices and displays.

Full color perception is produced in the eye by three-color receptor nerve cell types called cones. The three types are sensitive to different wavelengths of light: long, medium, and short ("red", "green", and "blue", respectively). The relative density of the three differs significantly from one another. There are slightly more red receptors than green receptors. There are very few blue receptors compared to red or green receptors. In addition to the color receptors, there are relative wavelength insensitive receptors called rods that contribute to monochrome night vision.

The human vision system processes the information detected by the eye in several perceptual channels: luminance, chromanance, and motion. Motion is only important for flicker threshold to the imaging system designer. The luminance channel takes the input from all of the available receptors, cones and rods. It is "color blind". It processes the information in such a manner that the contrast of edges is enhanced. The chromanance channel does not have edge contrast enhancement. Since the luminance channel uses and enhances every receptor, the resolution of the luminance channel is several times higher than the chromanance channel. The blue receptor contribution to luminance perception is less than 5%, or one part in twenty. Thus, the error introduced by lowering the blue resolution by one octave will be barely noticeable by the most perceptive viewer, if at all, as experiments at NASA, Ames Research Center (R. Martin, J. Gille, J. Larimer, Detectability of Reduced Blue Pixel Count in Projection Displays, SID Digest 1993) have demonstrated.

Color perception is influenced by a process called "assimilation", or the Von Bezold color blending effect. This is what allows separate color pixels (or sub-pixels or emitters) of a display to be perceived as the mixed color. This blending effect happens over a given angular distance in the field of view. Because of the relatively scarce blue receptors, this blending happens over a greater angle for blue than for red or green. This distance is approximately 0.25° for blue, while for red or green it is approximately 0.12°. At a viewing distance of twelve inches, 0.25° subtends 50 mils ($1,270\mu$) on a display. Thus, if the blue pixel pitch is less than half ($625\mu$) of this blending pitch, the colors will blend without loss of picture quality.

The present state of the art of color single plane imaging matrix, for flat panel displays and solid state camera chips is the (red-green-blue) RGB color triad. The system takes advantage of the Von Bezold effect by separating the three colors and placing equal spatial frequency weight on each color. Two manufacturers have shown improvements in display design by using dual or triple panels whose images are superimposed. One manufacturer of projection displays used three panels, red, green, and blue. The blue panel utilizes reduced resolution in accordance with the match between human vision requirements and the displayed image. Another manufacturer, Planar Systems of Beaverton, Oreg. employs a "Multi-row Addressing" technique having a dual electroluminescent panel, one panel with red and green pixels, the other with blue pixels to build a developmental model. The blue pixels have reduced resolution in the vertical axis only. This allows the blue phosphors to be excited at a higher rate than the red and green pixels, thus overcoming a problem with lower blue phosphor brightness. The problem with the prior art is that in providing the same matched resolution balance between human vision and display, additional display panels/planes are used, along with additional driver electronics.

Other display methods such as disclosed in U.S. Pat. No. 6,008,868 to Silverbrook use binary controlled emitters. In using binary controlled emitters, each emitter has a discrete luminance value, therefore, requiring the display to have an exact area to luminance relationship. This prior art used reduced blue "bit depth" built into the panel in accordance with human vision's lower blue color space increments. Conventional display methods also use a single color in a vertical stripe. Since conventional stripes have limited the Modulation Transfer Function (MTF), high spatial frequency resolution, in the horizontal axis, stripes of a single color are non-optimal.

Display devices can include liquid crystal display (LCD) devices. LCD devices have been used in a variety of applications, including calculators, watches, color televisions, and computer monitors. A conventional liquid crystal panel typically includes a pair of transparent glass substrates that are arranged in parallel to define a narrow gap therebetween that is filled with a liquid crystal material. A plurality of pixel electrodes typically are disposed in a matrix on an inner surface of one of the transparent glass substrates, and a plurality of common electrodes corresponding to the pixel electrodes are arranged on the inner surface of the other substrate of the two transparent glass substrates. A liquid crystal cell is defined by opposing pixel electrodes and common electrodes. Images are displayed by controlling light transmission through the cell according to a voltage applied to the electrode pair.

In a conventional active matrix LCD device, a plurality of row lines are formed on one substrate, transverse to a plurality of column lines. A plurality of pixel electrodes are disposed on a corresponding plurality of pixels regions defined by the row and column lines. A respective thin-film transistor (TFT) is formed on a respective one of the pixel regions, and drives the pixel electrode formed thereon.

Repeatedly driving a liquid crystal cell with voltages having the same polarity can cause an electrochemical change in the pixel electrode and the common electrode due to migration of ionic impurities within the liquid crystal material. This change can significantly reduce display sensitivity and brightness. Accordingly, it is generally desirable to repeatedly invert the polarity of the voltage applied to the liquid crystal cell in order to prevent this phenomenon. This method of driving a liquid crystal cell is known as "inversion". There are several inversion schemes that are known in the art, including "frame inversion", "column inversion", "line (or row) inversion", or "dot inversion".

A conventional dot inversion driving technique involves applying column line voltages that have different polarities to adjacent sub-pixel electrodes, for example, by driving alternating pixel elements with negative and positive voltages. Typically, the polarity of the driving voltage applied to a given pixel electrode is inverted each time the voltage is applied. The applied voltage is stored on the sub-pixel, row by row, alternating with each row. The result is a "checker board" pattern of polarities on the two dimensional matrix of sub-pixels.

Although the above-mentioned conventional dot-inversion driving technique is useful to prevent ion migration in the liquid crystal material and lowering perceived "flicker" in the display. Special care must be taken when applying "dot inversion" to the novel arrangement of the three-color pixel elements, and its associated drive structure to avoid this "flicker".

SUMMARY

The drawbacks and disadvantages of the prior art are overcome by the arrangement of color pixels for full color imaging devices with simplified addressing.

An array and row and column line architecture for a display is disclosed. The array consists of a plurality of row and column positions and a plurality of three-color pixel elements. Each three-color pixel element can comprise a blue emitter, a pair of red emitters, and a pair of green emitters. Several designs for the three-color pixel element are contemplated. The drive matrix consists of a plurality of row and column drivers to drive the individual emitters. The row drivers drive the red, green and blue emitters in each row. The red and green emitters in each column are driven by a single column driver. However, a single column driver can drive two column lines of blue emitters, a first column line and a second column line of the next nearest neighboring three-color pixel element. Thus, the number of column lines and associated driver electronics, as used in the prior art, are reduced in the present invention.

A drive matrix for an array of three-color pixel elements is also disclosed. While the array consists of a plurality of rows and columns of each three-color pixel element of the present invention, the drive matrix consists of a plurality of row and column drivers to drive the individual emitters. The row drivers drive the red, green and blue emitters in each row. The red and green emitters in each column are driven by a single column driver. However, a single column driver can drive two column lines of blue emitters, a first column line and a second column line of the next nearest neighboring three-color pixel element. Thus, also reducing the number of column lines and associated driver electronics.

Methods of driving a three-color pixel element in a display are disclosed. The method comprises providing a three-color pixel element having any of several contemplated designs. The blue emitter, the red emitters, and the green emitters are driven, such that the blue emitter of the three-color pixel element is coupled to a blue emitter of a next nearest neighboring three-color pixel element.

BRIEF DESCRIPTION OF THE DRAWINGS

Referring now to the figures, wherein like elements are numbered alike.

DETAILED DESCRIPTION

Those of ordinary skill in the art will realize that the following description of the present invention is illustrative only and not in any way limiting. Other embodiments of the invention will readily suggest themselves to such skilled persons.

The arrangement of three-color pixel elements influences the effect of the blending of the colors of the pixels. Each three-color pixel element comprises at least a blue emitter, a red emitter, and a green emitter and can be group in several different designs. A plurality of row drivers and column (or column line) drivers are operated to drive the individual emitters. The row drivers drive the red, green and blue emitters in each row. The red and green emitters in each column are driven by a single column driver. However, reduction of the number of column drivers can be achieved by using a single column driver to drive two column lines of blue emitters, a first column line and a second column line of the next nearest neighboring three-color pixel element. This arrangement aids in the driving of the display device, especially liquid crystal display devices, by dot inversion methods.

Figure 1:
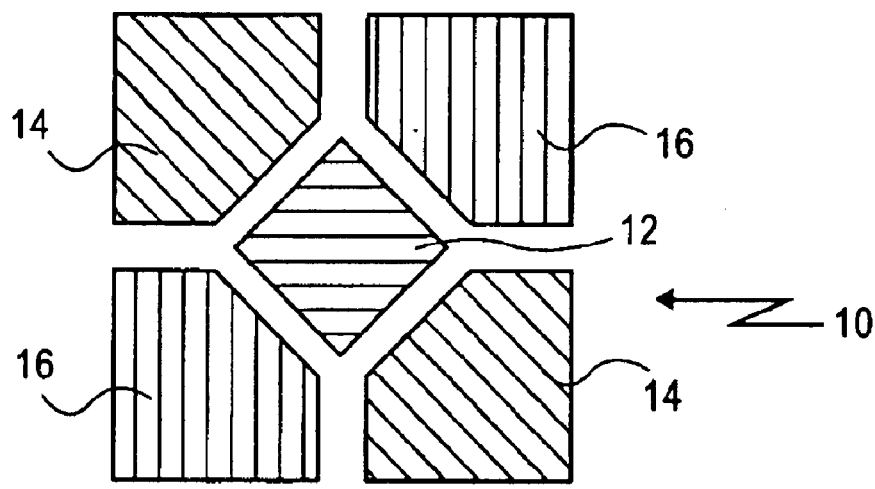
FIG. 1 is an arrangement of a three-color pixel element.

FIG. 1 shows an illustrative embodiment of an arrangement of a three-color pixel element 10. The three-color pixel element consists of a blue emitter 12, two red emitters 14, and two green emitters 16. The three-color pixel element 10 is square shaped and is centered at the origin of an X, Y coordinate system. The blue emitter 12 is centered at the origin of the square and extends into the first, second, third, and fourth quadrants of the X, Y coordinate system. A pair of red emitters 14 are disposed in opposing quadrants (i.e., the second and the fourth quadrants), and a pair of green emitters 16 are disposed in opposing quadrants (i.e., the first and the third quadrants), occupying the portions of the quadrants not occupied by the blue emitter 12. As shown in FIG. 1, the blue emitter 12 is square shaped, having corners aligned at the X and Y axes of the coordinate system, and the opposing pairs of red 14 and green 16 emitters are generally square shaped, having truncated inwardly-facing corners forming edges parallel to the sides of the blue emitter 12.

Figure 2:
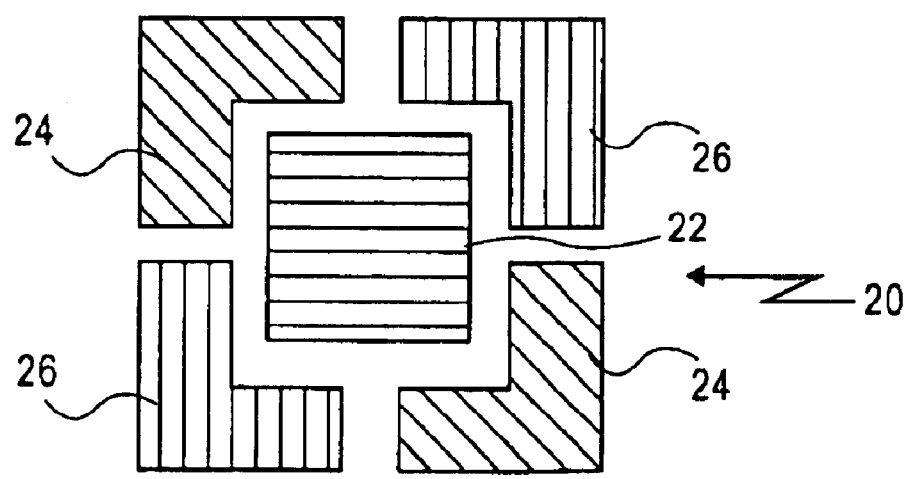
FIG. 2 is another arrangement of a three-color pixel element.

Another illustrative embodiment of a three-color pixel element 20 is shown in FIG. 2. In this embodiment, the three-color pixel element 20 is also square shaped and is centered at the origin of an X, Y coordinate system, extending into the first, second, third, and fourth quadrants of the X, Y coordinate system. The blue emitter 22 is centered at the origin of the square and is square shaped having sides aligned parallel to the X and Y axes of the coordinate system. A pair of red emitters 24 are disposed in opposing quadrants (i.e., the second and the fourth quadrants), and a pair of green emitters 26 are disposed in opposing quadrants (i.e., the first and the third quadrants), occupying the portions of the quadrants not occupied by the blue emitter 22. In this embodiment, the opposing pairs of red emitters 24 and green emitters 26 are L-shaped. The L-shaped emitters envelop the blue emitter having the inside corners of the L-shaped emitters aligned with the corners of the blue emitter.

According to a preferred embodiment, the three-color pixel element has equal red, green and blue emitter areas. This may be achieved by placing in the center of the three-color pixel element a blue emitter having an area larger than the areas of the individual red and green emitters. Those of ordinary skill in the art will recognize that, in other embodiments, the area of the blue emitter may be smaller in relation to either the red or green emitters. The blue emitter can be brighter than either the red or green emitters can, or it can be the same brightness as the red and green emitters can. For example, the drive-to-luminance gain of the blue emitter may be greater than that of the red or green emitters.

Although the above description is illustrative of a preferred embodiment, those of ordinary skill in the art will readily recognize other alternatives. For example, the emitters may have different shapes, such as rounded or polygonal. They may also be diffuse rather than having sharp edges. The three-color pixel elements need not be arranged with equal spatial frequency in each axis. The aperture ratio between the emitters may be minimized to substantially non-existent or it may be very pronounced, and the space may also be different colors, including black or white. The emitters may be any technology known or invented in the future, such as displays using Liquid Crystal (LCD), Plasma, Thin Film Electroluminescent, Discrete Light Emitting Diode (LED), Polymer Light Emitting Diode, Electro-Chromic, Electro-Mechanical, Incandescent Bulb, or Field Emission excited phosphor (FED).

Figure 3:
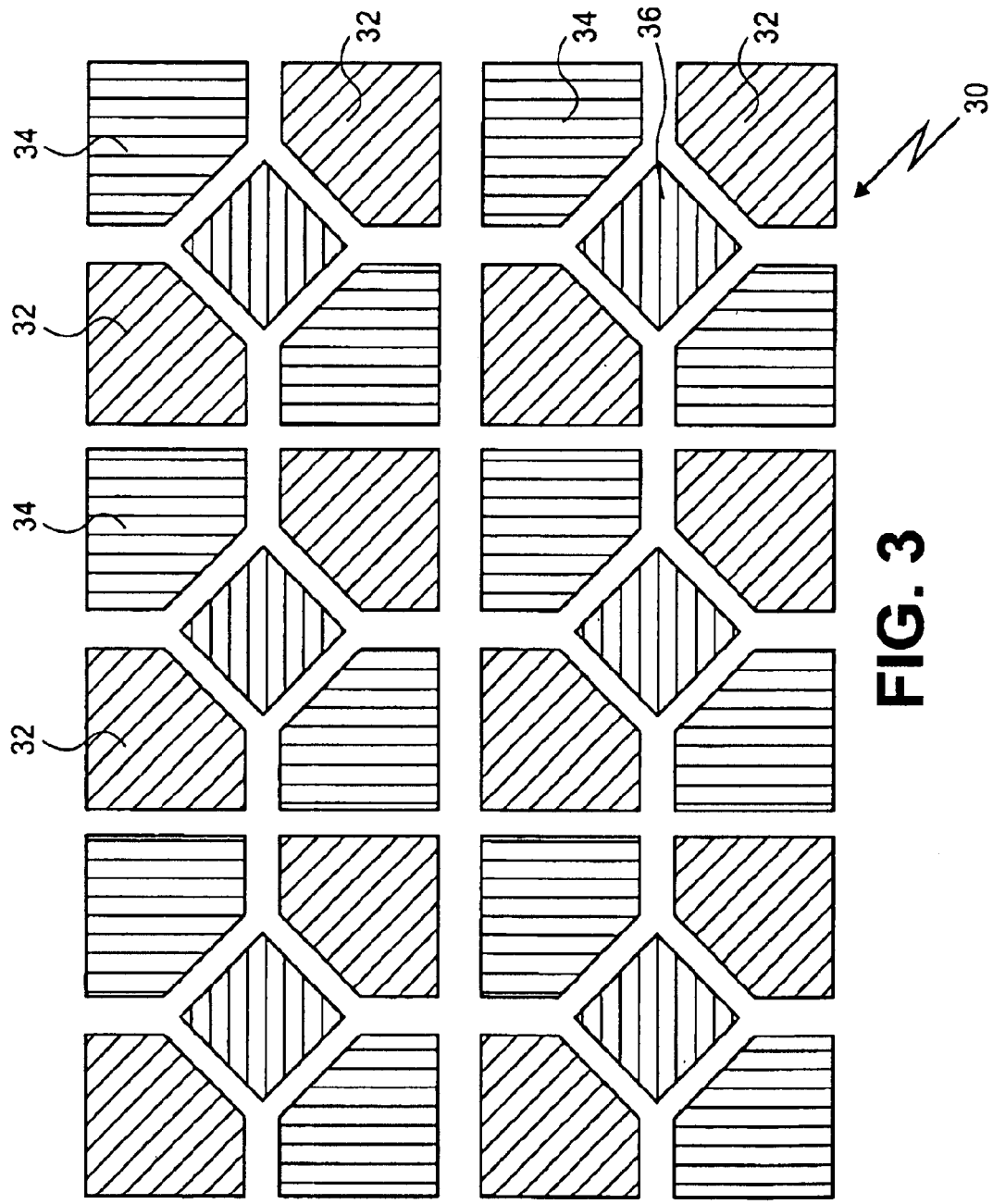
FIG. 3 is an array of three-color pixel elements.

FIG. 3 is an array 30 of the three-color pixel elements 10 of FIG. 1. The array 30 is repeated across a panel or chip to complete a device with a desired matrix resolution. The repeating three-color pixel elements 10 form a "checker board" of alternating red 32 and green 34 emitters with blue emitters 36 distributed evenly across the device, but at half the resolution of the red 32 and green 34 emitters.

One advantage of the three-color pixel element array is improved resolution of color displays. This occurs since only the red and green emitters contribute significantly to the perception of high resolution in the luminance channel. Thus, reducing the number of blue emitters and replacing some with red and green emitters improves resolution by more closely matching human vision.

Dividing the red and green emitters in half in the vertical axis to increase spatial addressability is an improvement over the conventional vertical single color stripe of the prior art. An alternating "checkerboard" of red and green emitters allows the Modulation Transfer Function (MTF), high spatial frequency resolution, to increase in both the horizontal and the vertical axes.

The three-color pixel element array may also be used in solid state image capture devices found in modern consumer video cameras and electronic still cameras. An advantage of using the reduced blue emitter resolution in both image capture and display is that stored images do not need to supply the same resolution for each color in storage or processing. This presents potential savings during coding, compression, and decompression of electronically stored images, including software and hardware in electronic imaging and display systems such as computers, video games, and television, including High Definition Television (HDTV) recording, playback, broadcasting, and display.

Figure 4:
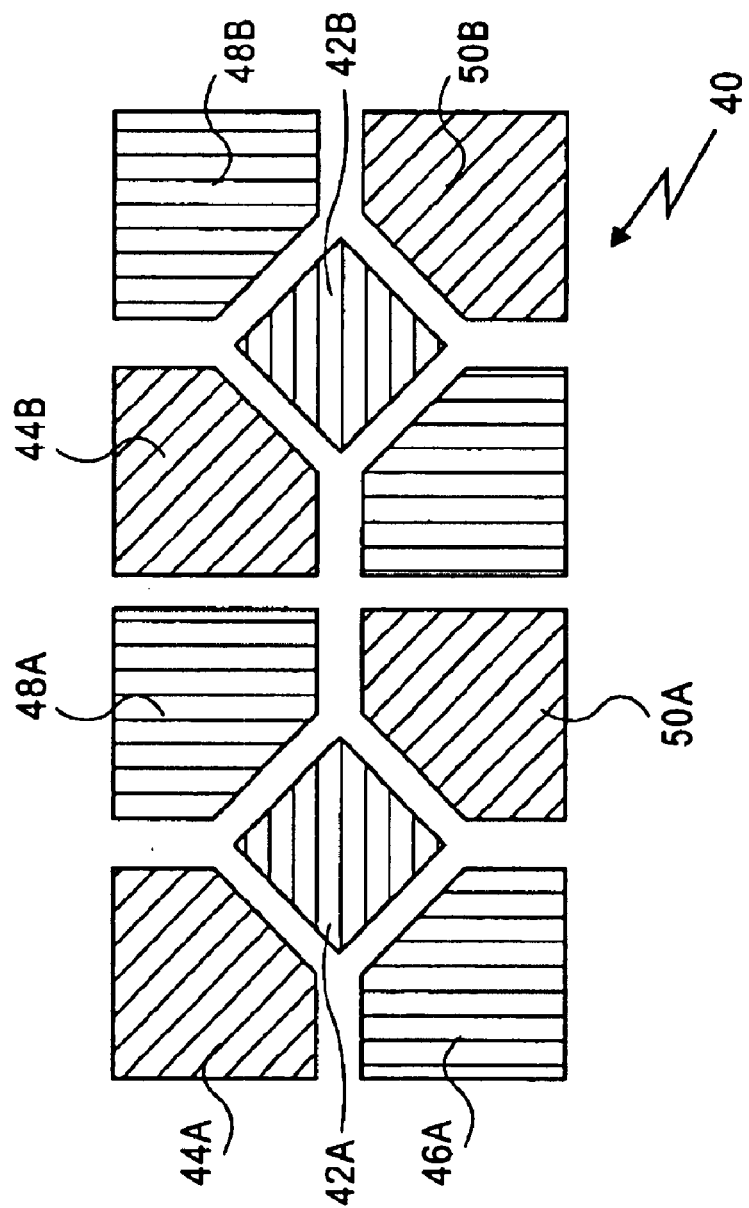
FIG. 4 is an arrangement of two three-color pixel elements, aligned horizontally.

FIG. 4 is an arrangement 40 of two three-color pixel elements aligned horizontally. The three-color pixel elements are square-shaped and each is centered at each origin of an X, Y coordinate system. The blue emitter 42a is centered at the origin of the square of the first three-color pixel element and extends into the first, second, third, and fourth quadrants of its X, Y coordinate system. Blue emitter 42b is centered at the origin of the square of the second three-color pixel element and extends into the first, second, third, and fourth quadrants of its X, Y coordinate system. Red emitters 44a and 44b are disposed in the second quadrants of the first and second pixel elements, respectively. Green emitters 46a and 46b are disposed in the third quadrants of the first pixel and second pixel elements, respectively. Green emitters 48a and 48b are disposed in the first quadrant of the first pixel and second pixel elements. Red emitters 50a and 50b are disposed in the fourth quadrants of the first pixel and second pixel elements, respectively. As shown in FIG. 4, each blue emitter (e.g., 42a) is square-shaped having corners aligned at the X and Y axes of each coordinate system. The opposing pairs of red emitters (e.g., 44a and 50a) and green emitters (e.g., 48a and 46a) are generally square shaped, having truncated inwardly-facing corners forming edges parallel to the sides of the blue emitter (e.g., 42a). In each three-color pixel element, the red and green emitters occupy the portion of the quadrant not occupied by the blue emitter.

Figure 5:
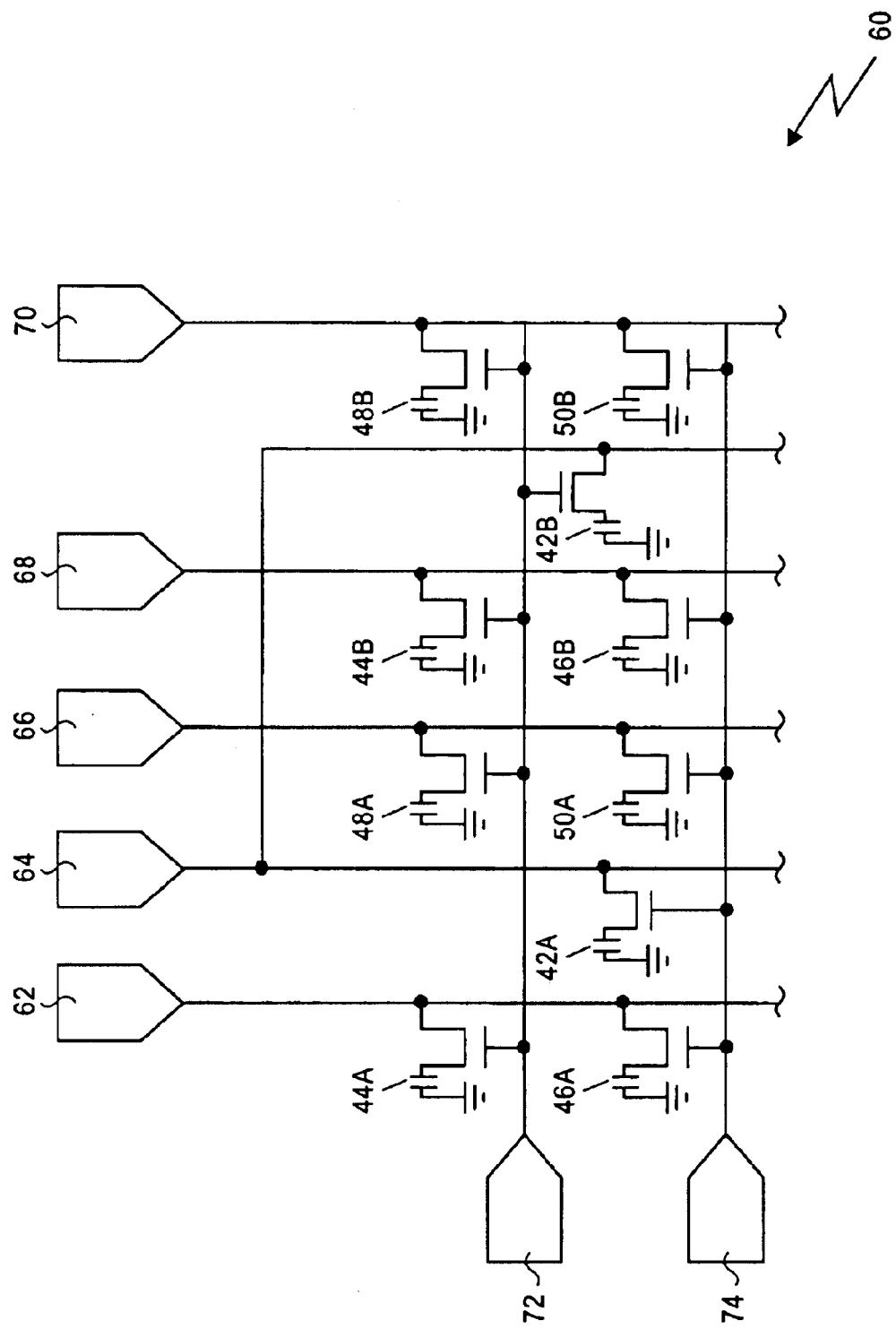
FIG. 5 is a diagram showing an illustrative drive matrix for the pixel arrangement of FIG. 4.

FIG. 5 is a diagram of an illustrative drive matrix 60 for the three-color pixel element arrangement 40. The liquid crystal display emitters are schematically represented as capacitors for convenience. Each liquid crystal display emitter is coupled to the row and column lines through a select transistor, as in FIG. 5 with red emitter 44a. The liquid crystal display emitters are coupled through the gate of the select transistor to the row line. The column line is coupled to the first source/drain terminal of the select transistor and the second source/drain terminal of the select transistor, which is coupled to the liquid crystal display emitter. A fixed potential is coupled to the liquid crystal display emitter. The liquid crystal display emitters of the invention may be active electronic devices such as Thin Film Transistors (TFT) found in Active Matrix Liquid Crystal Display (AMLCD), or Charge Coupled Devices (CCD) as found in camera chips, or other suitable devices.

The illustrative drive matrix 60 shown in FIG. 5 consists of a 2×5 drive matrix, where four column drivers drive the red and green emitters coupled to column lines and a single column driver drives the blue emitters coupled to column lines. A first column driver 62 drives the red emitter 44a and the green emitter 46a. The blue emitters 42a and 42b are tied together and driven by a second column driver 64. A third column driver 66 drives the green emitter 48a and the red emitter 50a, while a fourth column driver 68 drives the red emitter 44b and the green emitter 46b. The green emitter 48b and the red emitter 50b are driven by a fifth column driver 70. Alternative embodiments, using at least four three-color pixel elements with two row drivers and ten column drivers, are presented further herein.

The row drivers drive the red, green and blue emitters in each row line. Row driver 72 drives red emitters 44a and 44b, green emitters 48a and 48b, as well as blue emitter 42b. Row driver 74 drives green emitters 46a and 46b, red emitters 50a and 50b and blue emitter 42a. Each emitter can be driven at continuous luminance values at specific locations in a pixel element, unlike emitters in the prior art, which are driven at discrete luminance values at random locations in a three-color pixel element.

The drive matrix uses approximately 16% fewer column drivers to present a given image than does a prior art 2×6-drive matrix for the triad arrangement. The column lines are reduced since the blue emitters 12 are combined. This entire arrangement can be turned 90 degrees such that the combined blue emitters 12 are driven by the same row driver. All such topologically identical variants known in the art are possible embodiments. In addition, the driver type, voltage, and timing can be the same as already known in the art for each device technology.

Figure 6:
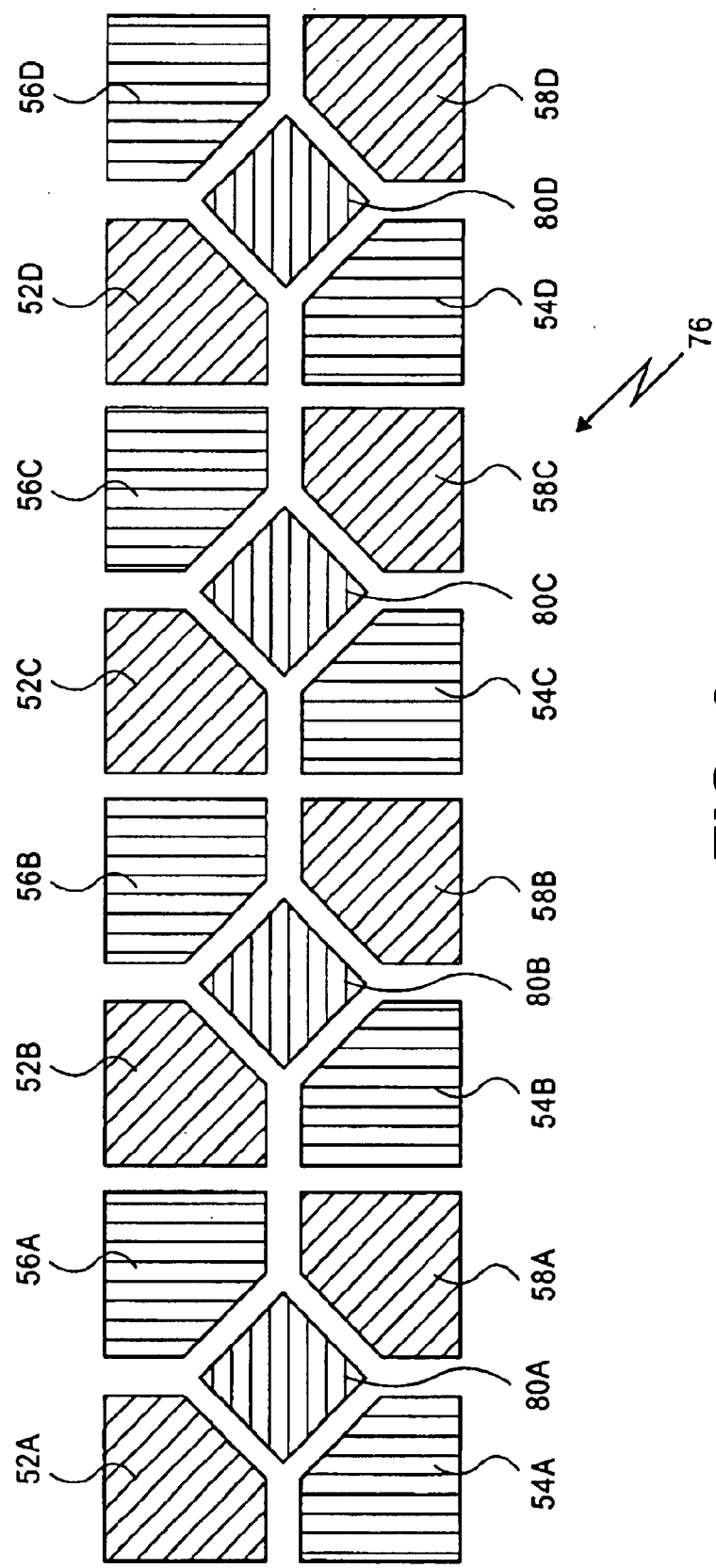
FIG. 6 is an arrangement of four three-color pixel elements, aligned horizontally.
Figure 7:
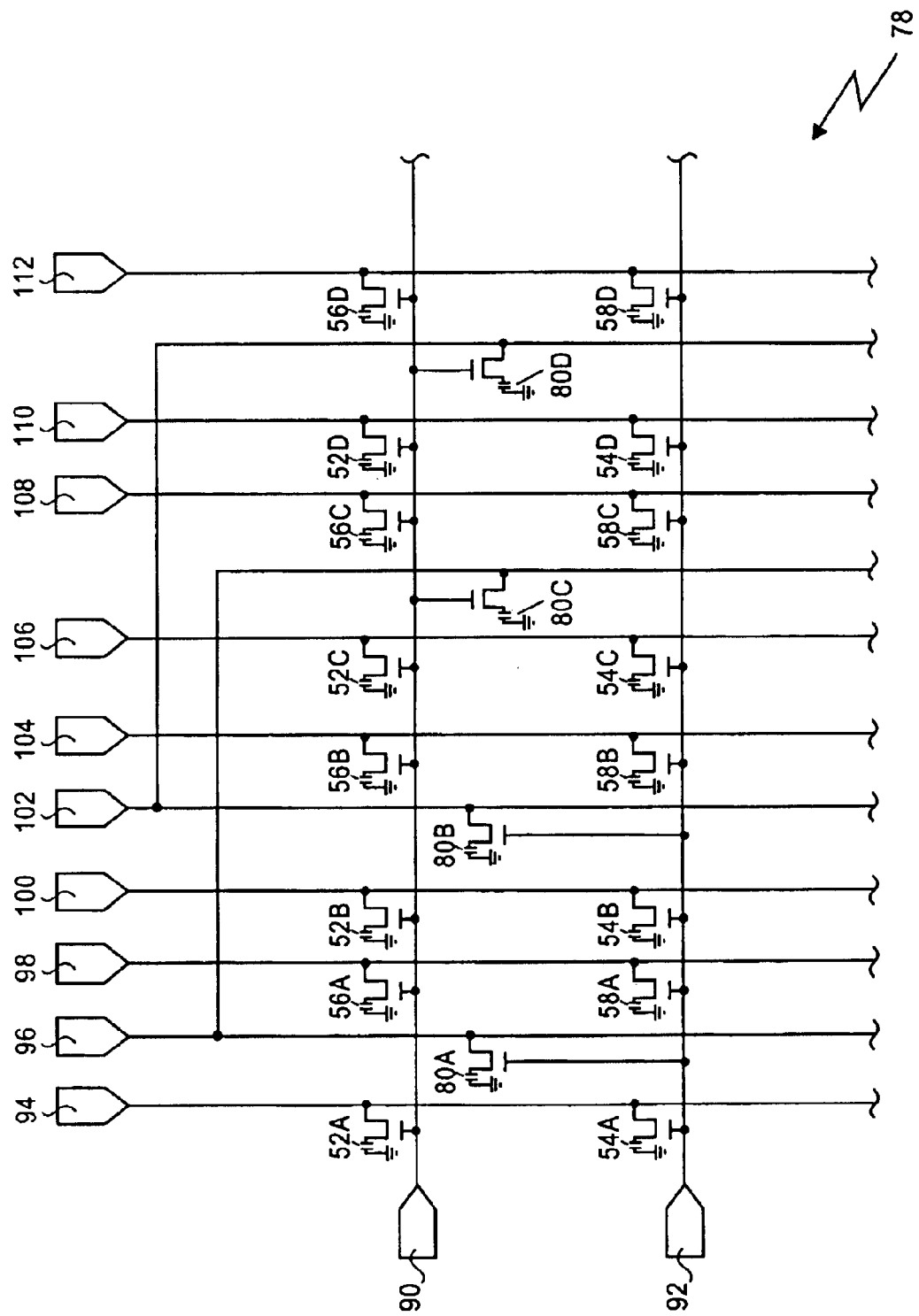
FIG. 7 is a diagram showing an illustrative drive matrix for the pixel arrangement of FIG. 6.

An alternative embodiment of an arrangement and drive matrix is illustrated in FIGS. 6 and 7. FIG. 6 is an arrangement 76 of four three-color pixel elements aligned horizontally. Each three-color pixel element is square-shaped and each is centered at each origin of an X, Y coordinate system. In this case, the blue emitters 80a, 80b, 80c, and 80d are centered at the origin of the square of each of the three-color pixel elements. The blue emitters 80a, 80b, 80c, and 80d extend into the first, second, third, and fourth quadrants of each X, Y coordinate system. Red emitters 52a, 52b, 52c, and 52d are disposed in the second quadrants of the first, second, third, and fourth three-color pixel elements, respectively. Green emitters 54a, 54b, 54c, and 54d are disposed in the third quadrants of the first, second, third, and fourth three-color pixel elements, respectively. Green emitters 56a, 56b, 56c, and 56d are disposed in the first quadrants of the first, second, third, and fourth three-color pixel elements, respectively. Red emitters 58a, 58b, 58c, and 58d are disposed in the fourth quadrants of the first, second, third, and fourth three-color pixel elements, respectively. As shown in FIG. 6, each blue emitter (e.g., 80a) is square-shaped, having corners aligned at the X and Y axes of each coordinate system. The opposing pairs of red emitters (e.g., 52a and 58a) and green emitters (e.g., 54a and 56a) are generally square shaped, having truncated inwardly-facing corners forming edges parallel to the sides of the blue emitter (e.g., 80a). In each three-color pixel element, the red and green emitters occupy the portion of the quadrant not occupied by the blue emitter.

FIG. 7 is a diagram of an illustrative drive matrix 78 for the arrangement 76. The illustrative drive matrix 78 shown in FIG. 7 consists of a 2×10 drive matrix, where eight colunm drivers drive the eight red and eight green emitters coupled to column lines and two column drivers drive the four blue emitters coupled to column lines. A first column driver 94 drives the red emitter 52a and the green emitter 54a. The blue emitters 80a and 80c are tied together and driven by a second column driver 96. A third column driver 98 drives the green emitter 56a and the red emitter 58a, while a fourth column driver 100 drives the red emitter 52b and the green emitter 54b. A fifth column driver 102 drives the blue emitter 80b, which is tied together with 80d. The green emitter 56b and the red emitter 58b are driven by a sixth column driver 104, while a seventh column driver 106 drives red emitter 52c and green emitter 54c. An eighth column driver 108 drives green emitter 56c and red emitter 58c, while a ninth column driver 110 drives red emitter 52d and green emitter 54d. Finally, a tenth column driver 112 drives green emitter 56d and red emitter 58d.

The row drivers drive the red, green and blue emitters in each row line. Row driver 90 drives red emitters 52a, 52b, 52c, and 52d, green emitters 56a, 56b, 56c, and 56d, as well as blue emitters 80c and 80d. Row driver 92 drives green emitters 54a, 54b, 54c, and 54d, red emitters 58a, 58b, 58c, and 58d, and blue emitters 80a and 80b. Each emitter can be driven at continuous luminance values at specific locations in a pixel element, unlike emitters in the prior art, which are driven at discrete luminance values at random locations in a three-color pixel element.

The drive matrix uses approximately 16.6% fewer column drivers to present a given image than does a prior art 2×12-drive matrix for the triad arrangement. The column lines are reduced since the blue emitters (80a and 80c; 80b and 80d) are combined. The driver type, voltage, and timing can be the same as already known in the art for each device technology.

Figure 8:
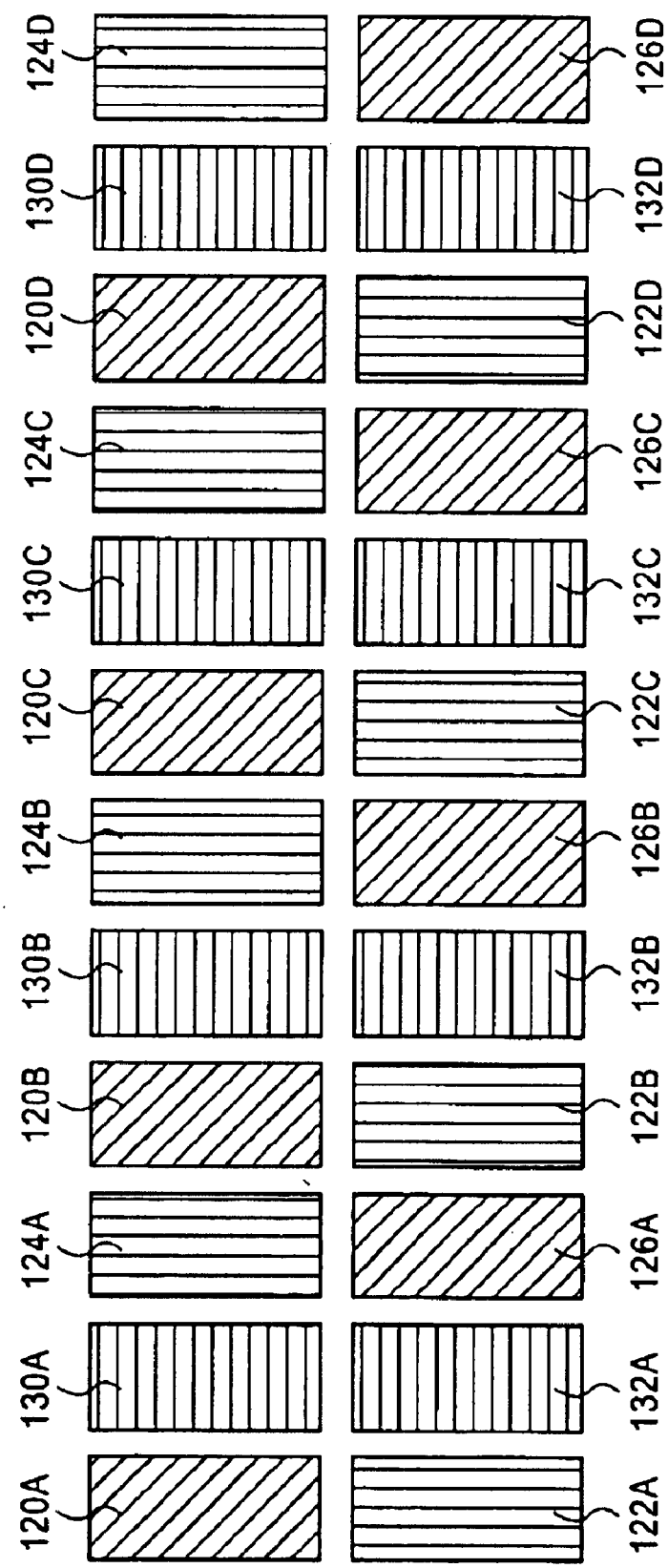
FIG. 8 is another arrangement of four three-color pixel elements, aligned horizontally.
Figure 9:
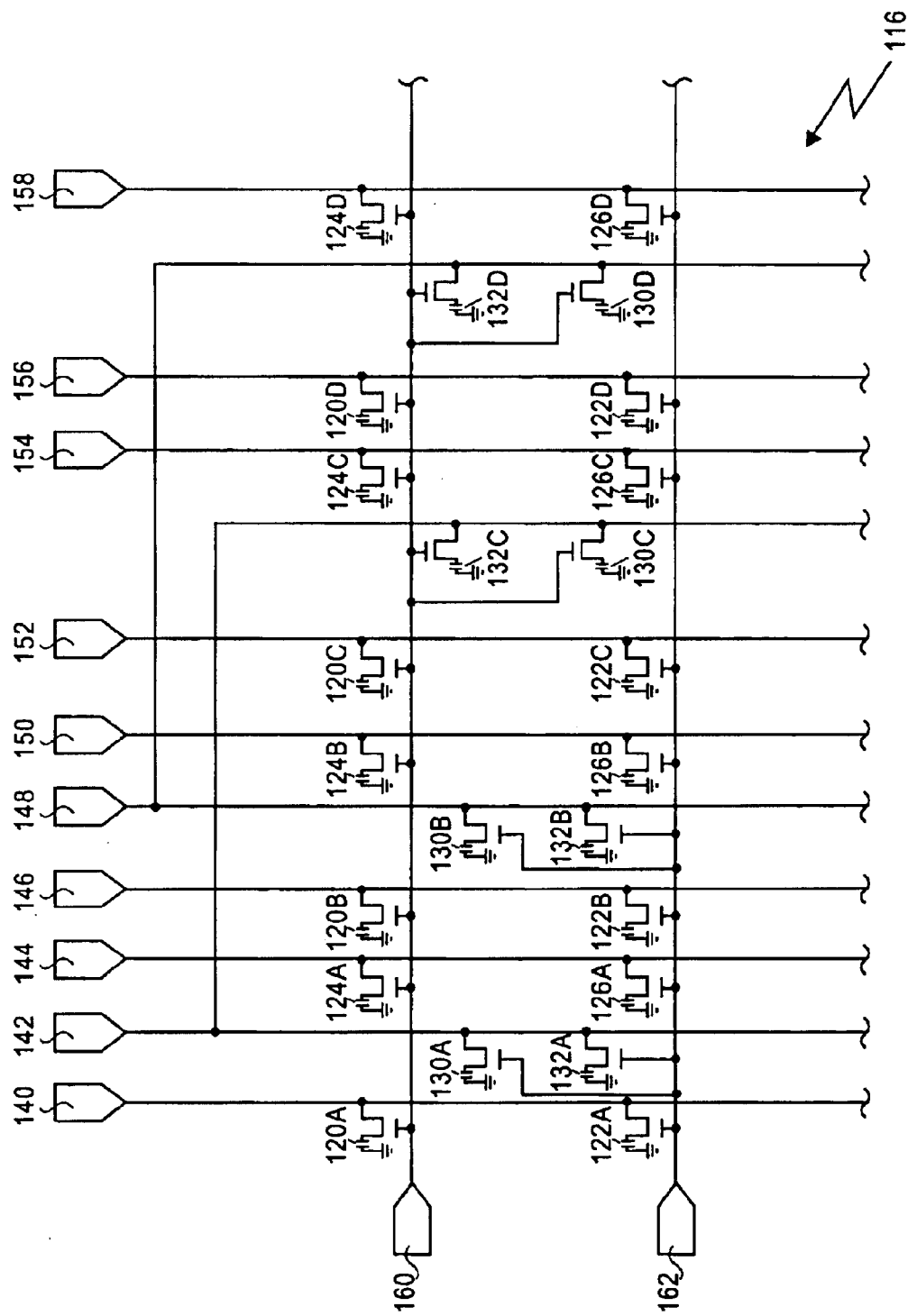
FIG. 9 is a diagram showing an illustrative drive matrix for the pixel arrangement of FIG. 8.

Another embodiment of a three-color pixel element arrangement and drive matrix is illustrated in FIGS. 8 and 9. FIG. 8 is an arrangement 114 of four three-color pixel elements aligned horizontally in an array row. Each three-color pixel element can be square-shaped or rectangular-shaped and has two rows including three unit-area polygons, such that an emitter occupies each unit-area polygon. Disposed in the center of the first pixel row of the first, second, third, and fourth three-color pixel elements are blue emitters 130a, 130b, 130c, and 130d, respectively. Disposed in the center of the second pixel row of the first, second, third, and fourth three-color pixel elements are blue emitters 132a, 132b, 132c, and 132d, respectively. Red emitters 120a, 120b, 120c, and 120d are disposed in the first pixel row, to the left of blue emitters 130a, 130b, 130c, and 130d, of the first, second, third, and fourth three-color pixel elements, respectively. Green emitters 122a, 122b, 122c, and 122d are disposed in the second pixel row, to the left of blue emitters 132a, 132b, 132c, and 132d, of the first, second, third, and fourth three-color pixel elements, respectively. Green emitters 124a, 124b, 124c, and 124d are disposed in the first pixel row, to the right of blue emitters 130a, 130b, 130c, and 130d, of the first, second, third, and fourth three-color pixel elements, respectively. Red emitters 126a, 126b, 126c, and 126d are disposed in the second pixel row, to the right of blue emitters 132a, 132b, 132c, and 132d, of the first, second, third, and fourth three-color pixel elements, respectively.

FIG. 9 is a diagram of an illustrative drive matrix 116 for the three-color pixel element arrangement 114. The illustrative drive matrix 116 shown in FIG. 9 consists of a 2×10 drive matrix, where eight column drivers drive the eight red and eight green emitters coupled to column lines and two column drivers drive the four blue emitters coupled to column lines. A first column driver 140 drives the red emitter 120a and the green emitter 122a. The blue emitters 130a, 132a, 130c, and 132c are tied together and driven by a second column driver 142. A third column driver 144 drives the green emitter 124a and the red emitter 126a, while a fourth column driver 146 drives the red emitter 120b and the green emitter 122b. A fifth column driver 148 drives blue emitters 130b and 132b, which are tied together with 130d and 132d. The green emitter 124b and the red emitter 126b are driven by a sixth column driver 150, while a seventh column driver 152 drives red emitter 120c and green emitter 122c. An eighth column driver 154 drives green emitter 124c and red emitter 126c, while a ninth column driver 156 drives red emitter 120d and green emitter 122d. Finally, a tenth column driver 158 drives green emitter 124d and red emitter 126d.

The row drivers drive the red, green and blue emitters in each row line. Row driver 160 drives red emitters 120a, 120b, 120c, and 120d, green emitters 124a, 124b, 124c, and 124d, as well as blue emitters 130c, 132c, 130d, and 132d. Row driver 162 drives green emitters 122a, 122b, 122c,and 122d, red emitters 126a, 126b, 126c, and 126d, and blue emitters 130a, 132a, 130b, and 132b. Each emitter can be driven at continuous luminance values at specific locations in a pixel element, unlike emitters in the prior art, which are driven at discrete luminance values at random locations in a three-color pixel element.

The drive matrix uses approximately 16.6% fewer column drivers to present a given image than does a prior art 2×12-drive matrix for the triad arrangement. The column lines are reduced since the blue emitters (130a, 132a and 130c, 132c; 130b, 132b and 130d, 132d) are combined. The driver type, voltage, and timing can be the same as already known in the art for each device technology.

Figure 10:
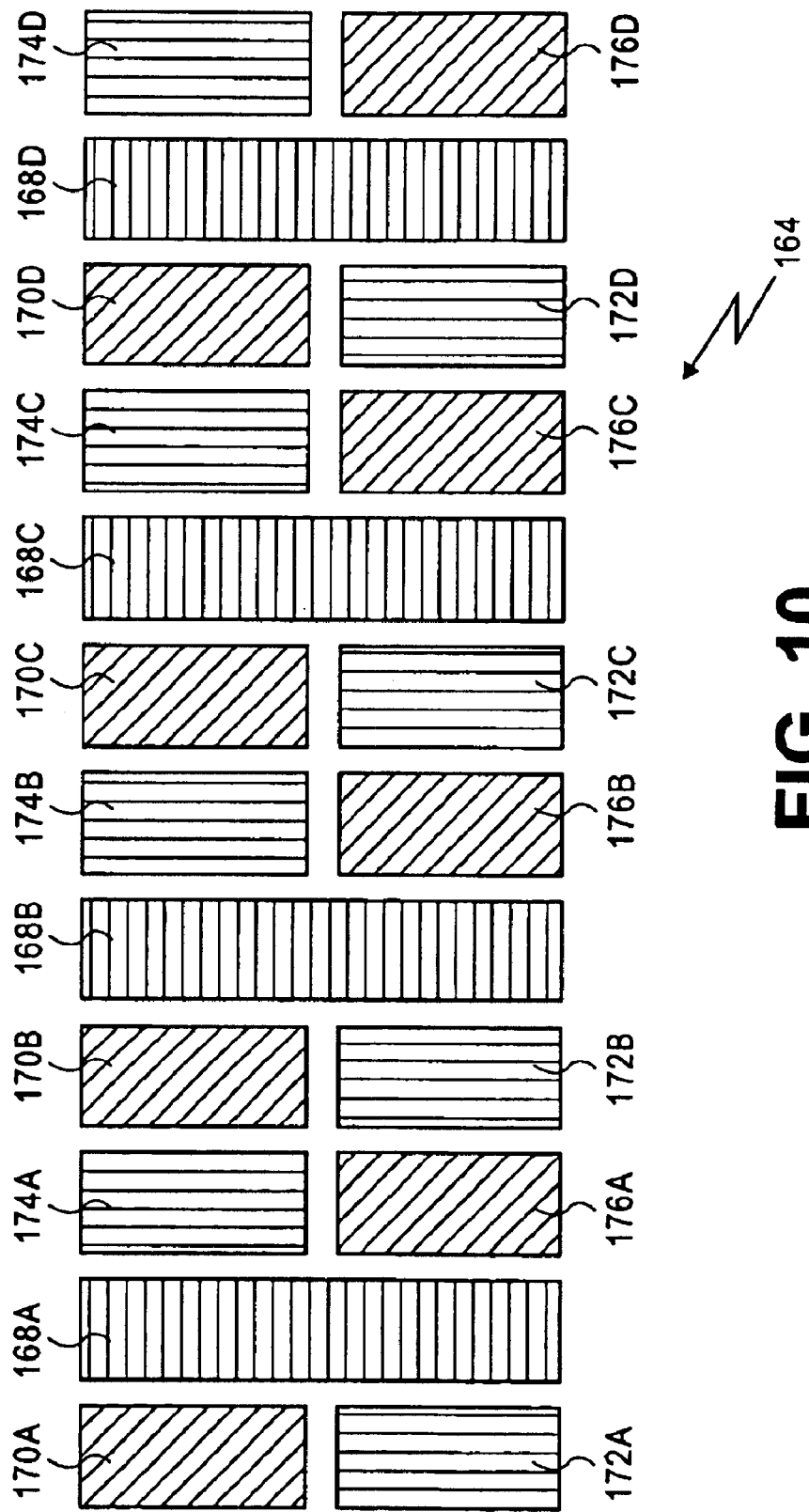
FIG. 10 is another arrangement of four three-color pixel elements, aligned horizontally.
Figure 11:
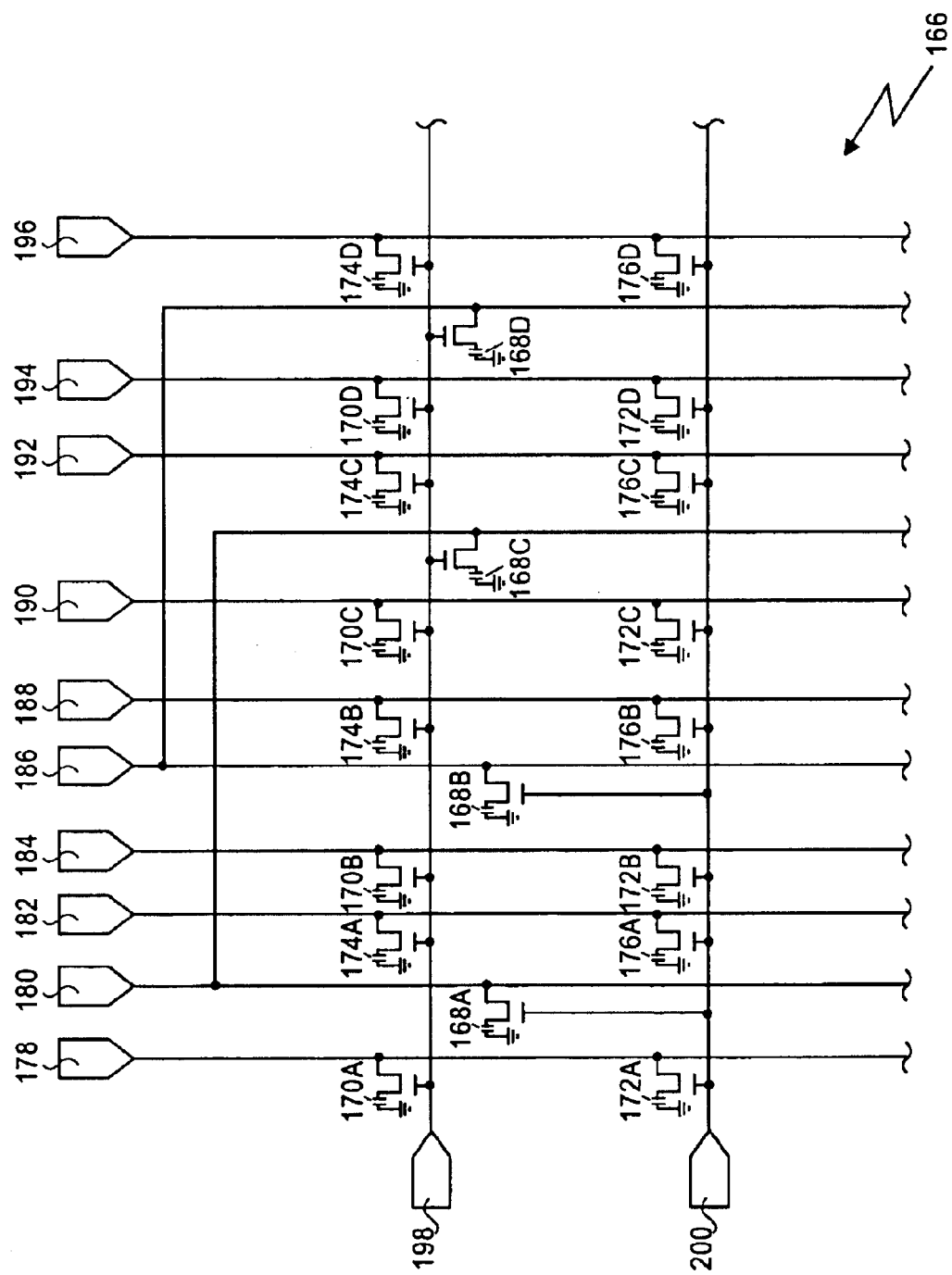
FIG. 11 is a diagram showing an illustrative drive matrix for the pixel arrangement of FIG. 10.

Another embodiment of a three-color pixel element arrangement and drive matrix is illustrated in FIGS. 10 and 11. FIG. 10 is an arrangement 164 of four three-color pixel elements aligned horizontally in an array row. Each three-color pixel element can be square-shaped or rectangular-shaped and has two rows with each row including three unit-area polygons, such that an emitter occupies each unit-area polygon. At least one unit-area polygon is at least two times the area of the other unit-area polygons and is occupied by blue emitters 168a, 168b, 168c, and 168d. The blue emitters 168a, 168b, 168c, and 168d can be formed as a single emitter or can be two separate blue emitters wired together.

As illustrated in FIG. 10, blue emitters 168a, 168b, 168c, and 168d are disposed between the red emitters and green emitters of the first, second, third, and fourth three-color pixel elements, respectively. The red emitters and green emitters are disposed in two pixel rows. Red emitters 170a, 170b, 170c, and 170d are disposed in the first pixel row, to the left of blue emitters 168a, 168b, 168c, and 168d, of the first, second, third, and fourth three-color pixel elements, respectively. Green emitters 172a, 172b, 172c, and 172d are disposed in the second pixel row, to the left of blue emitters 168a, 168b, 168c, and 168d, of the first, second, third, and fourth three-color pixel elements, respectively. Green emitters 174a, 174b, 174c, and 174d are disposed in the first pixel row, to the right of blue emitters 168a, 168b, 168c, and 168d, of the first, second, third, and fourth three-color pixel elements, respectively. Red emitters 176a, 176b, 176c, and 176d are disposed in the second pixel row, to the right of blue emitters 168a, 168b, 168c, and 168d, of the first, second, third, and fourth three-color pixel elements, respectively. FIG. 11 is a diagram of an illustrative drive matrix 166 for the three-color pixel element arrangement 164. The illustrative drive matrix 78 shown in FIG. 11 consists of a 2×10 drive matrix, where eight column drivers drive the eight red and eight green emitters coupled to column lines and two column drivers drive the four blue emitters coupled to column lines. A first column driver 178 drives the red emitter 170a and the green emitter 172a. The blue emitters 168a and 168c are tied together and driven by a second column driver 180. A third column driver 182 drives the green emitter 174a and the red emitter 176a, while a fourth column driver 184 drives the red emitter 170b and the green emitter 172b. A fifth column driver 186 drives the blue emitter 168b, which is tied together with 168d. The green emitter 174b and the red emitter 176b are driven by a sixth column driver 188, while a seventh column driver 190 drives red emitter 170c and green emitter 172c. An eighth column driver 192 drives green emitter 174c and red emitter 176c, while a ninth column driver 194 drives red emitter 170d and green emitter 172d. Finally, a tenth column driver 196 drives green emitter 174d and red emitter 176d.

The row drivers drive the red, green and blue emitters in each row line. Row driver 198 drives red emitters 170a, 170b, 170c, and 170d, green emitters 174a, 174b, 174c, and 174d, as well as blue emitters 168c and 168d. Row driver 200 drives green emitters 172a, 172b, 172c, and 172d, red emitters 176a, 176b, 176c, and 176d, and blue emitters 168a and 168b. Each emitter can be driven at continuous luminance values at specific locations in a pixel element, unlike emitters in the prior art, which are driven at discrete luminance values at random locations in a three-color pixel element.

The drive matrix uses approximately 16.6% fewer column drivers to present a given image than does a prior art 2×12-drive matrix for the triad arrangement. The column lines are reduced since the blue emitters (168a and 168c; 168b and 168d) are combined. The driver type, voltage, and timing can be the same as already known in the art for each device technology.

Figure 12:
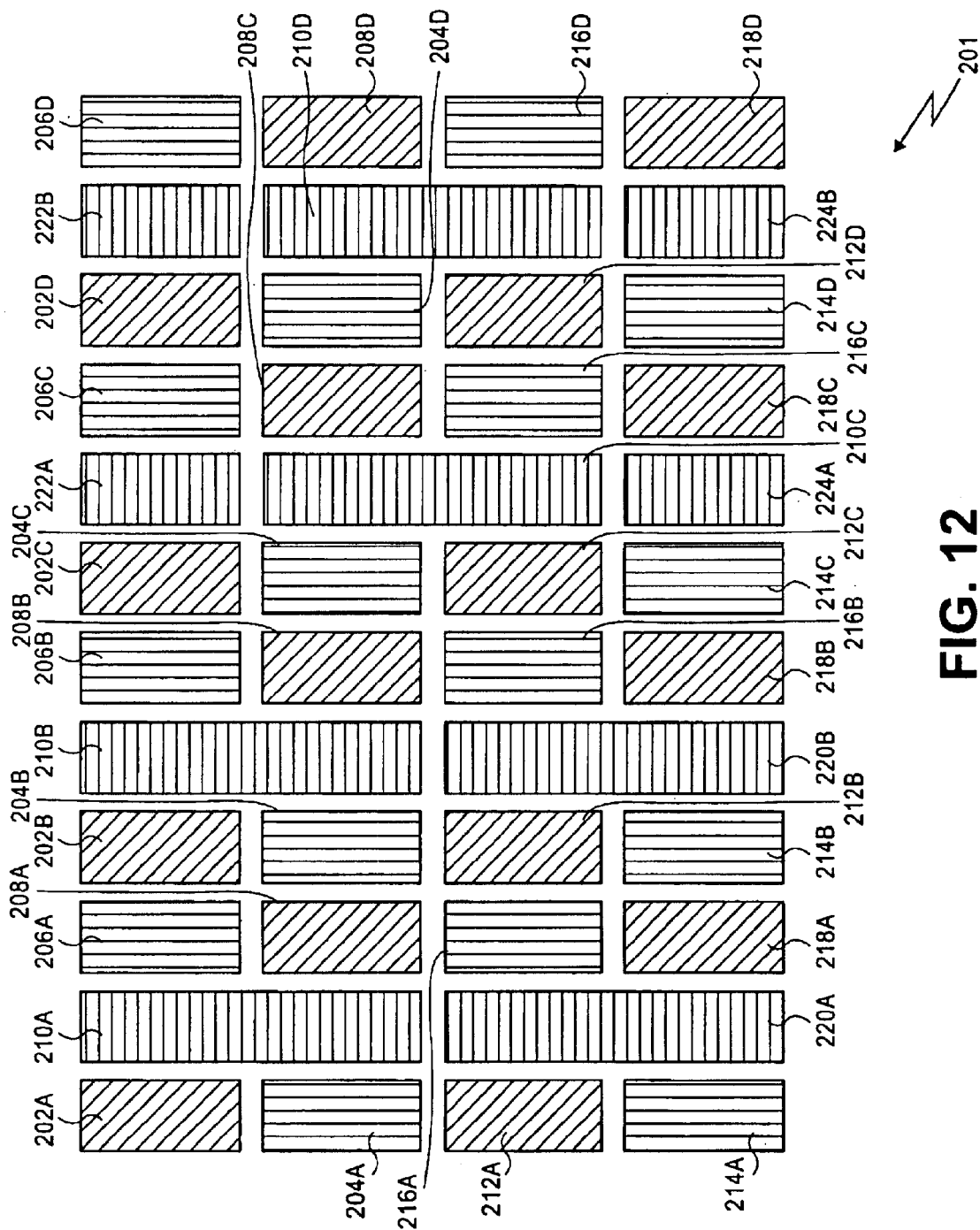
FIG. 12 is another arrangement of four three-color pixel elements, aligned horizontally.
Figure 13:
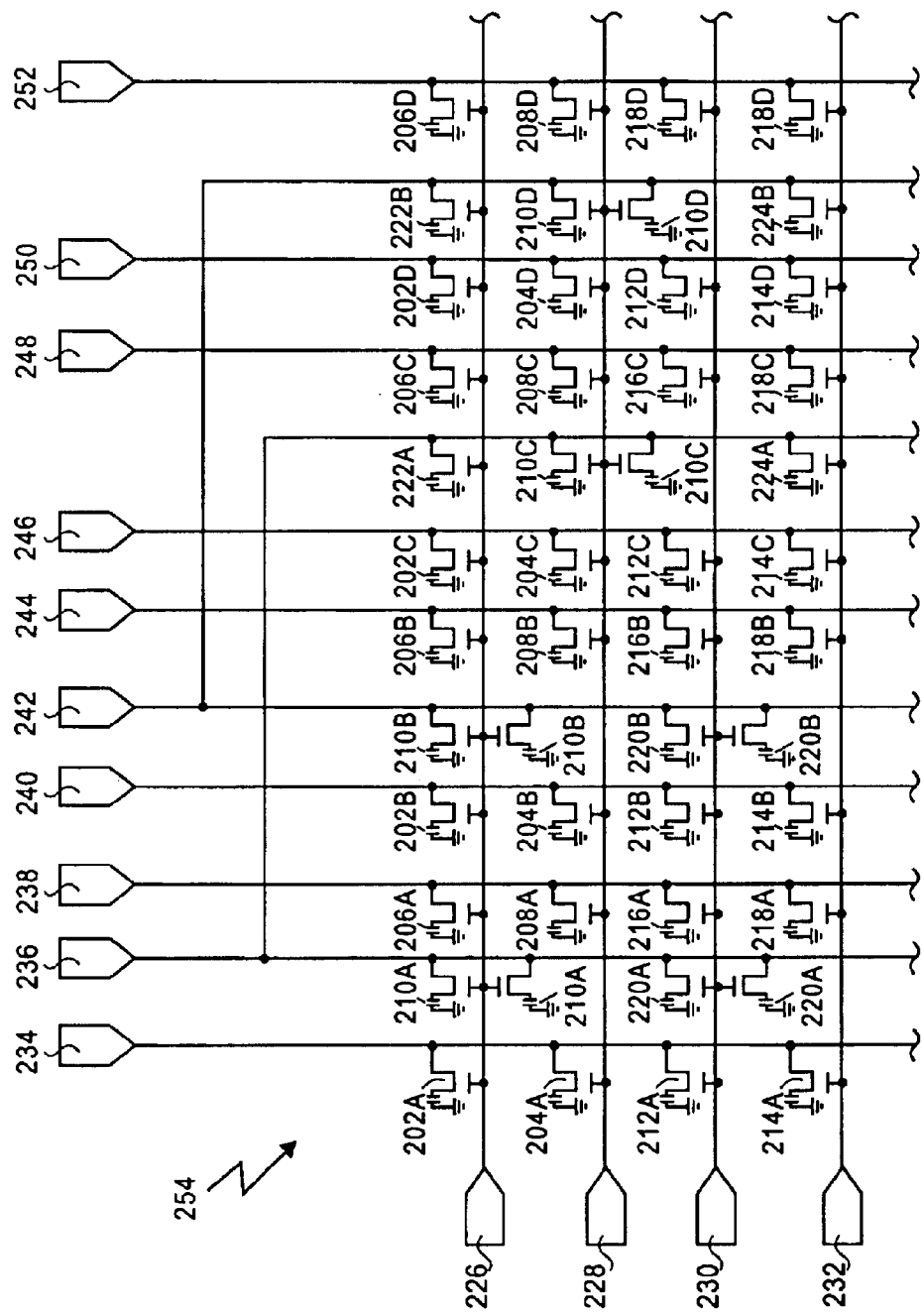
FIG. 13 is a diagram showing an illustrative drive matrix for the pixel arrangement of FIG. 12.

Another embodiment of a three-color pixel element arrangement and drive matrix is illustrated in FIGS. 12 and 13. FIG. 12 is an arrangement 201 of eight three-color pixel elements aligned horizontally, four in each array row. Each three-color pixel element can be square-shaped or rectangular-shaped and has two rows with each row including three unit-area polygons, such that an emitter occupies each unit-area polygon. At least one unit-area polygon is at least two times the area of the other unit-area polygons and is occupied by blue emitters 210a, 210b, 210c, 210d, 220a, and 220c. The blue emitters 210a, 210b, 210c, 210d, 220a, and 220c can be formed as a single emitter or can be two separate blue emitters wired together. In this arrangement 201, the blue emitters 210b and 210d are staggered such that a smaller blue emitter (the size of the red and green emitters) will be positioned at the edges of the array vertically aligned with the large blue emitter, as illustrated in FIG. 12. For example, blue emitters 222a, 224a are vertically disposed on either side of the staggered blue emitter 210c and blue emitters 222b, 224b are vertically disposed on either side of the staggered blue emitter 210d.

As illustrated in FIG. 12, blue emitters 210a, 210b, 210c, 210d, 220a, 220c, 222a, 222b, 224a, and 224b are disposed between the red emitters and green emitters. Red emitters 202a, 202b, 202c, 202d are disposed in the first pixel row of the first array row and green emitters 204a, 204b, 204c, and 204d are disposed in the second pixel row of the first array row to the left of blue emitters 210a, 210b, 210c & 222a, and 210d & 222b of the first, second, third, and fourth three-color pixel elements, respectively. Green emitters 206a, 206b, 206c, and 206d are disposed in the first pixel row of the first array row and red emitters 208a, 208b, 208c, and 208*d* are disposed in the second pixel row of the first array row to the right of blue emitters 210*a*, 210*b*, 210*c* & 222*a*, and 210*d* & 222*b* of the first, second, third, and fourth three-color pixel elements, respectively. Red emitters 212*a*, 212*b*, 212*c*, and 212*d* are disposed in the first pixel row of the second array row and green emitters 214*a*, 214*b*, 214*c*, and 214*d* are disposed in the second pixel row of the second array row to the left of blue emitters 220*a*, 220*b*, 220*c* & 224*a*, and 210*d* & 224*b* of the first, second, third, and fourth three-color pixel elements, respectively. Green emitters 216*a*, 216*b*, 216*c*, and 216*d* are disposed in the first pixel row of the second array row and red emitters 218*a*, 218*b*, 218*c*, and 218*d* are disposed in the second pixel row of the second array row to the right of blue emitters 220*a*, 220*b*, 220*c* & 224*a*, and 210*d* & 224*b* of the first, second, third, and fourth three-color pixel elements, respectively. An individual skilled in the art will appreciate that the large blue emitters are staggered throughout the array, which requires having smaller blue emitters at the edges vertically aligned with the larger blue emitters.

FIG. 13 is a diagram of an illustrative drive matrix 254 for the three-color pixel element arrangement 201 illustrated in FIG. 12. The illustrative drive matrix 254 shown in FIG. 13 consists of a 2×10 drive matrix, where eight column drivers drive the thirty-two red and eight green emitters coupled to column lines and two column drivers drive the ten blue emitters coupled to column lines. A first column driver 234 drives the red emitters 202*a*, 212*a* and the green emitters 204*a*, 214*a*. The blue emitters 210*a*, 220*a* are tied together with blue emitters 222*a*, 210*c*, 224*a* and are driven by a second column driver 236. A third column driver 238 drives the green emitters 206*a*, 216*a* and the red emitters 208*a*, 218*a*, while a fourth column driver 240 drives the red emitters 202*b*, 212*b* and the green emitters 204*b*, 214*b*. A fifth column driver 242 drives the blue emitters 210*b*, 220*b*, which is tied together with 222*b*, 210*d*, 224*b*. The green emitters 206*b*, 216*b* and the red emitters 208*b*, 218*b* are driven by a sixth column driver 244, while a seventh column driver 246 drives red emitters 202*c*, 212*c* and green emitters 204*c*, 214*c*. An eighth column driver 248 drives green emitters 206*c*, 216*c* and red emitters 208*c*, 218*c*, while a ninth column driver 250 drives red emitters 202*d*, 212*d* and green emitters 204*d*, 214*d*. Finally, a tenth column driver 252 drives green emitters 206*d*, 216*d* and red emitters 208*d*, 218*d*.

The row drivers drive the red, green and blue emitters in each row line. Row driver 226 drives red emitters 202*a*, 202*b*, 202*c*, and 202*d*, green emitters 206*a*, 206*b*, 206*c*, and 206*d*, as well as blue emitters 210*a*, 210*b*, 222*a*, 222*b*. Row driver 228 drives green emitters 204*a*, 204*b*, 204*c*, and 204*d*, red emitters 208*a*, 208*b*, 208*c*, and 208*d*, and blue emitters 210*c*, 210*d*. Row driver 230 drives red emitters 212*a*, 212*b*, 212*c*, and 212*d*, green emitters 216*a*, 216*b*, 216*c*, and 216*d*, as well as blue emitters 220*a*, 220*b*. Row driver 232 drives green emitters 214*a*, 214*b*, 214*c*, and 214*d*, red emitters 218*a*, 218*b*, 218*c*, and 218*d*, and blue emitters 224*a*, 224*b*. Each emitter can be driven at continuous luminance values at specific locations in a three-color pixel element, unlike emitters in the prior art, which are driven at discrete luminance values at random locations in a three-color pixel element.

The drive matrix uses approximately 16.6% fewer column drivers to present a given image than does a prior art 2×12-drive matrix for the triad arrangement. The column lines are reduced since the blue emitters (210*a*, 220*a* and 210*c*, 222*a*, 224*a*; 210*b*, 220*b* and 210*d*, 222*b*, 224*b*) are combined. The driver type, voltage, and timing can be the same as already known in the art for each device technology.

Dot inversion is the preferred method of choice for driving panels having the arrangement of columns and rows as discussed above. Each blue, red and green emitter is driven with alternating polarities. For example, in a first drive event, a red emitter is driven with a positive voltage and at the next drive event, the same red emitter is driven with a negative voltage. In using the arrangements illustrated in FIGS. 6, 8, 10, and 12 that connect the column line of the blue emitter of the first three-color pixel element with its next nearest neighboring three-color pixel element (e.g., the blue emitter of the third three-color pixel element). Likewise, the blue emitter of the second three-color pixel element is coupled with its next nearest neighboring three-color pixel element (e.g., the blue emitter of the fourth three-color pixel element). The "next nearest neighboring" three-color pixel element can be construed as being every other blue emitter of a pair of three-color pixel elements coupled together. For example, the first three-color pixel element is connected with the third three-color pixel element, the second three-color pixel element is connected with the fourth three-color pixel element, the fifth three-color pixel element is connected with the seventh three-color pixel element, the sixth three-color pixel element is connected with the eight three-color pixel element, etc. In this case, any incidence of "flicker" is reduced or eliminated.

Figure 14:
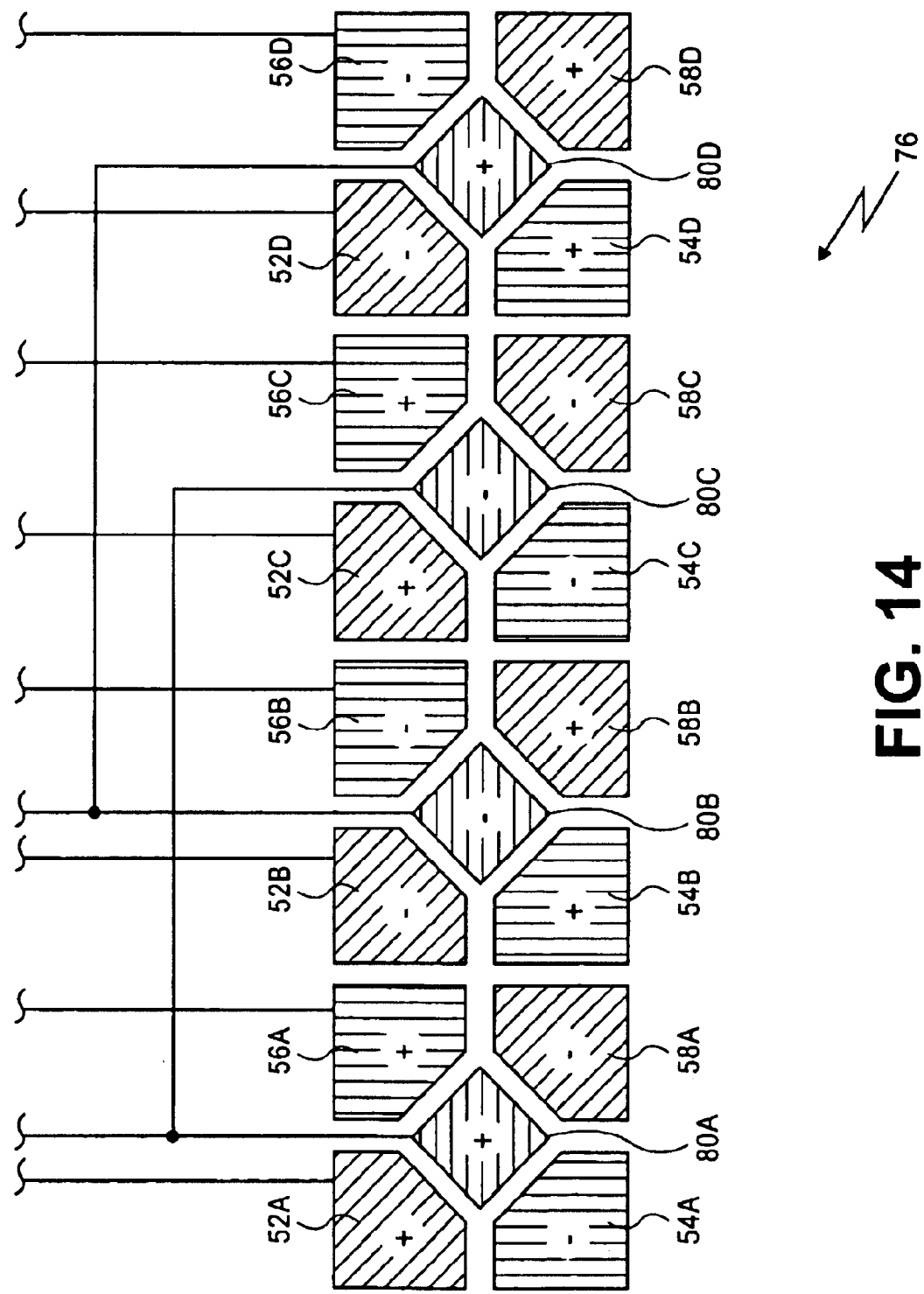
FIG. 14 is a diagram illustrating a dot inversion scheme for the pixel arrangement of FIG. 6.

In using these arrangements, every column line must be driven with a signal of polarity opposite of its neighbors to guarantee, that should any crosstalk occur, it would be the same for each column. If the array is not driven in this way, asymmetrical crosstalk will result in visible artifacts across the screen. Also, nearby red and green emitters of separate pixel elements must be driven by signals of the opposite polarity to ensure that "flicker" will not occur. For example, FIG. 14 illustrates the polarities of the red, green, and blue emitters on the same arrangement in FIG. 6. Here, green emitter 56*a* (having a negative value) must have an opposite polarity than red emitter 52*b* (having a positive value). This arrangement eliminates "flicker" since the column line connects one blue emitter with the blue emitter of its next nearest neighboring three-color pixel element. The polarities shown on the blue emitters are those of the column lines, not the polarities stored on the blue emitter. The polarity of the blue emitter is determined by the row that is actively addressing the blue emitter, which is connected to the blue emitter of its next nearest neighboring three-color pixel element.

Figure 15:
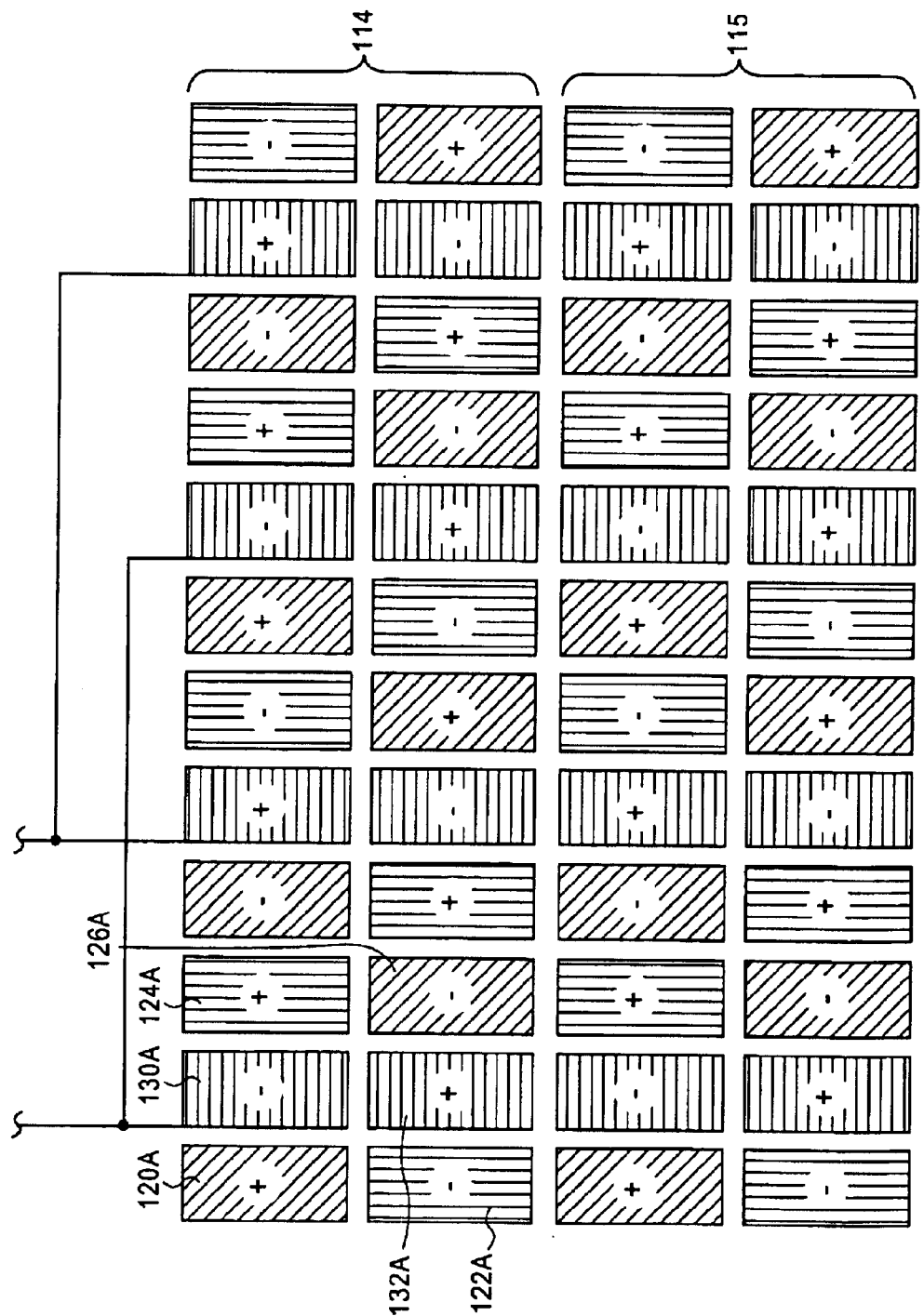
FIG. 15 is another diagram illustrating a dot inversion scheme for the pixel arrangement of FIG. 8.
Figure 16:
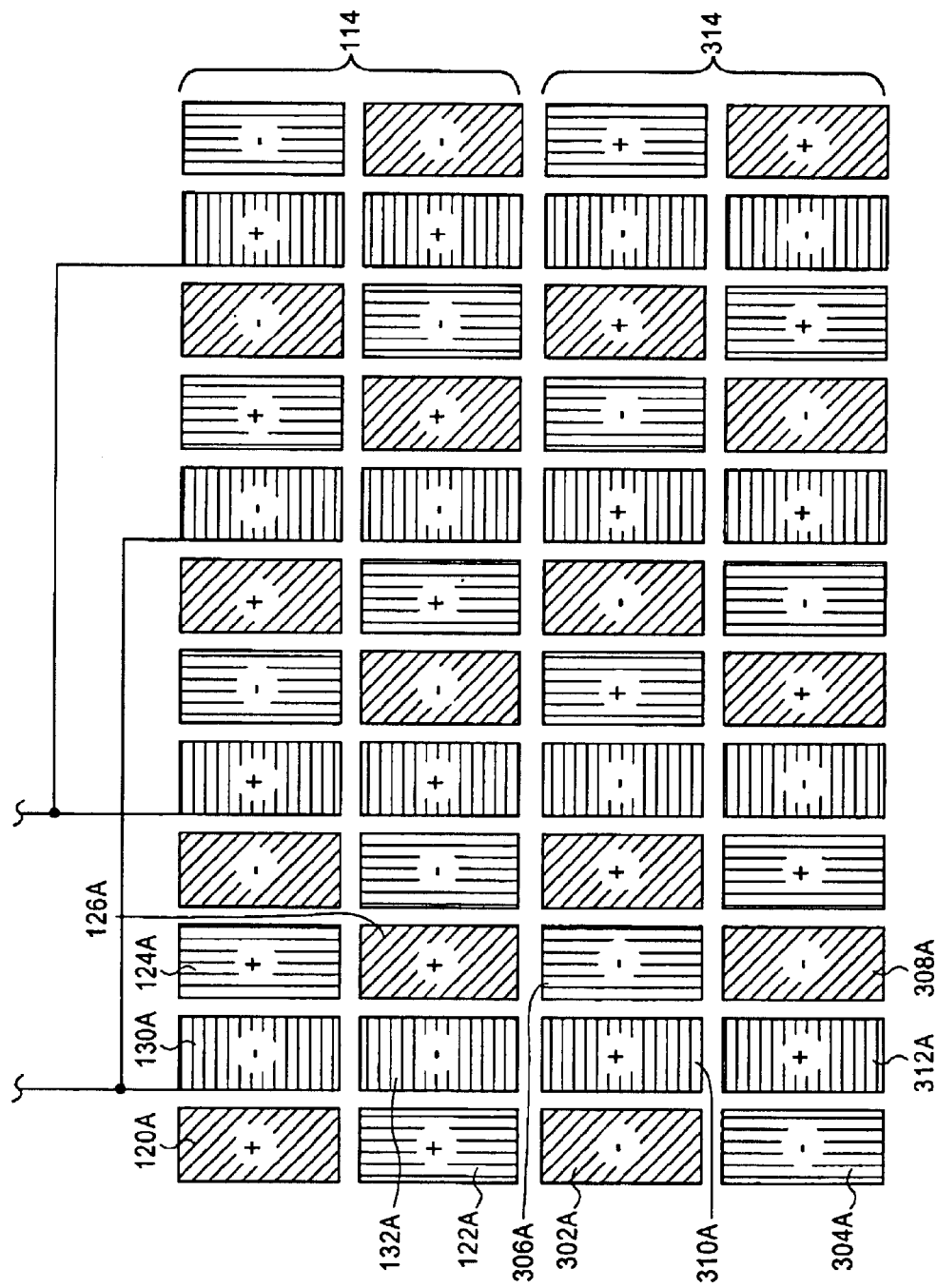
FIG. 16 is an alternate diagram for FIG. 15 also illustrating a dot inversion scheme for the pixel arrangement of FIG. 8.

Additional examples illustrating separate dot inversion schemes by the polarities of the red, green, and blue emitters are found in FIGS. 15 and 16. Both FIGS. 15 and 16 are based on the arrangement 114 illustrated in FIG. 8, including another horizontal arrangement (FIG. 15, 115; FIG. 16, 314). In FIG. 15, red emitter 120*a* (having a positive value) must be driven by signals of an opposite polarity than the polarity of the green emitter 122*a* (having a negative value). Blue emitter 130*a* (having a negative value) must be driven by signals of an opposite polarity than the polarity of the blue emitter 132*a* (having a positive value). Red emitter 124*a* (having a positive value) must be driven by signals of an opposite polarity than the polarity of the green emitter 126*a* (having a negative value). The same polarities are duplicated in the additional horizontal arrangement 115. This arrangement also eliminates "flicker" since the column lines connect one blue emitter with the blue emitter of its next nearest neighboring three-color pixel element.

In FIG. 16, an alternate dot inversion scheme is illustrated with horizontal arrangement 314. Here, red emitters 120*a* and 126*a* and green emitters 122*a* and 124*a* (having positive values) must be driven by signals of an opposite polarity than the polarity of the signals driving the red emitters 302a and 308a and green emitters 304a and 306a (having negative values). The same applies for blue emitters 130a and 132a (having positive values) and blue emitters 310a and 312a (having negative values). This arrangement also eliminates "flicker" since the column lines connect one blue emitter with the blue emitter of its next nearest neighboring three-color pixel element.

Figure 17:
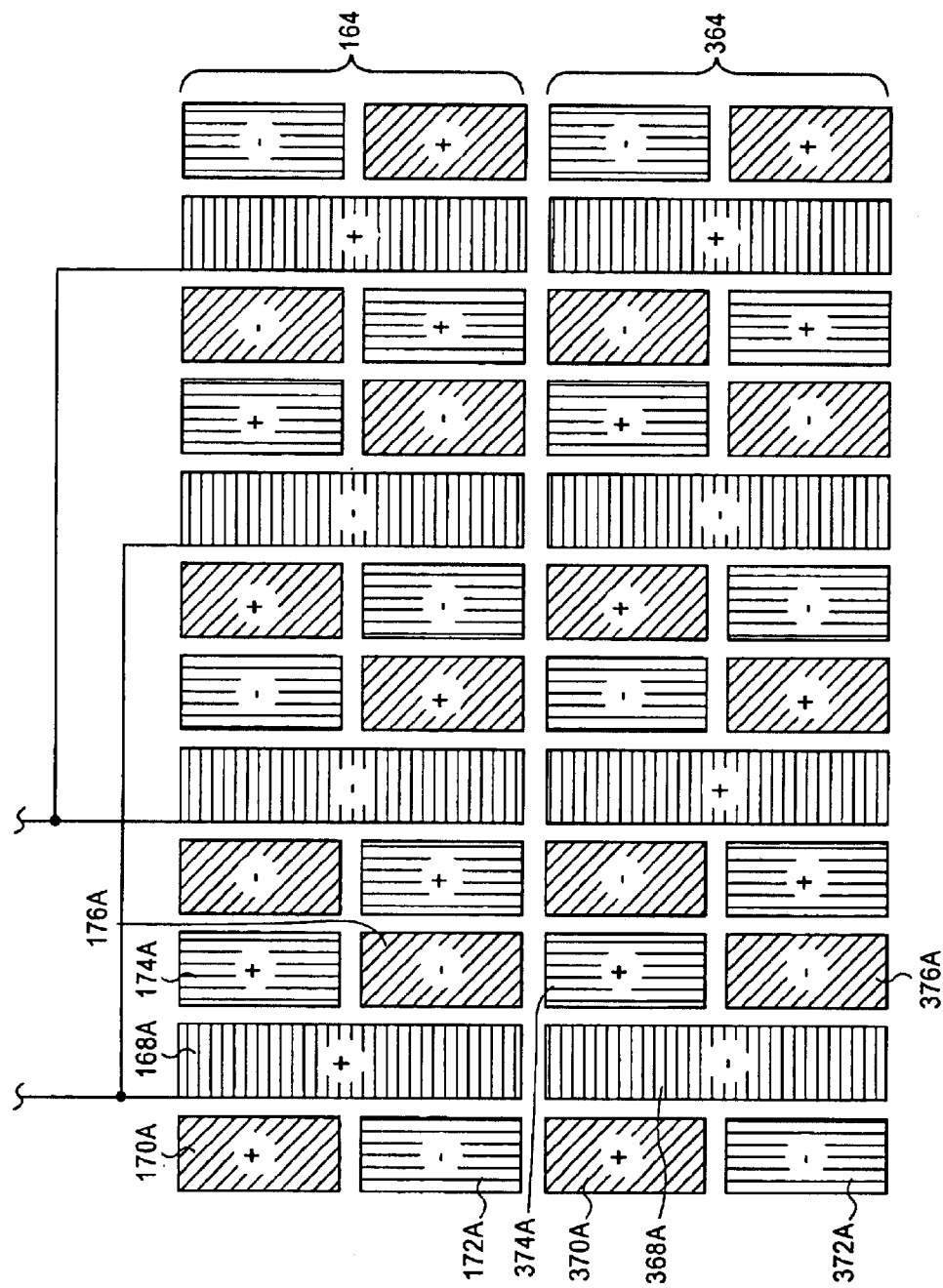
FIG. 17 is another diagram illustrating a dot inversion scheme for the pixel arrangement of FIG. 10.

Another example that illustrates dot inversion by the polarities of the red, green, and blue emitters is found in FIG. 17, which is based on the arrangement 164 illustrated in FIG. 10, including another horizontal arrangement 364. Here, red emitter 170a and green emitter 174a (having positive values) and green emitter 172a and red emitter 176a (having negative values) must be driven by signals of the same polarity as red emitter 370a and green emitter 374a (having positive values) and green emitter 372a and red emitter 376a (having negative values), respectively. Blue emitter 168a (having a positive value) must be driven by signals of an opposite polarity than blue emitter 368a (having a negative value). This arrangement also eliminates "flicker"0 since the column lines connect a blue emitter with the blue emitter of its next nearest neighboring three-color pixel element.

Figure 18:
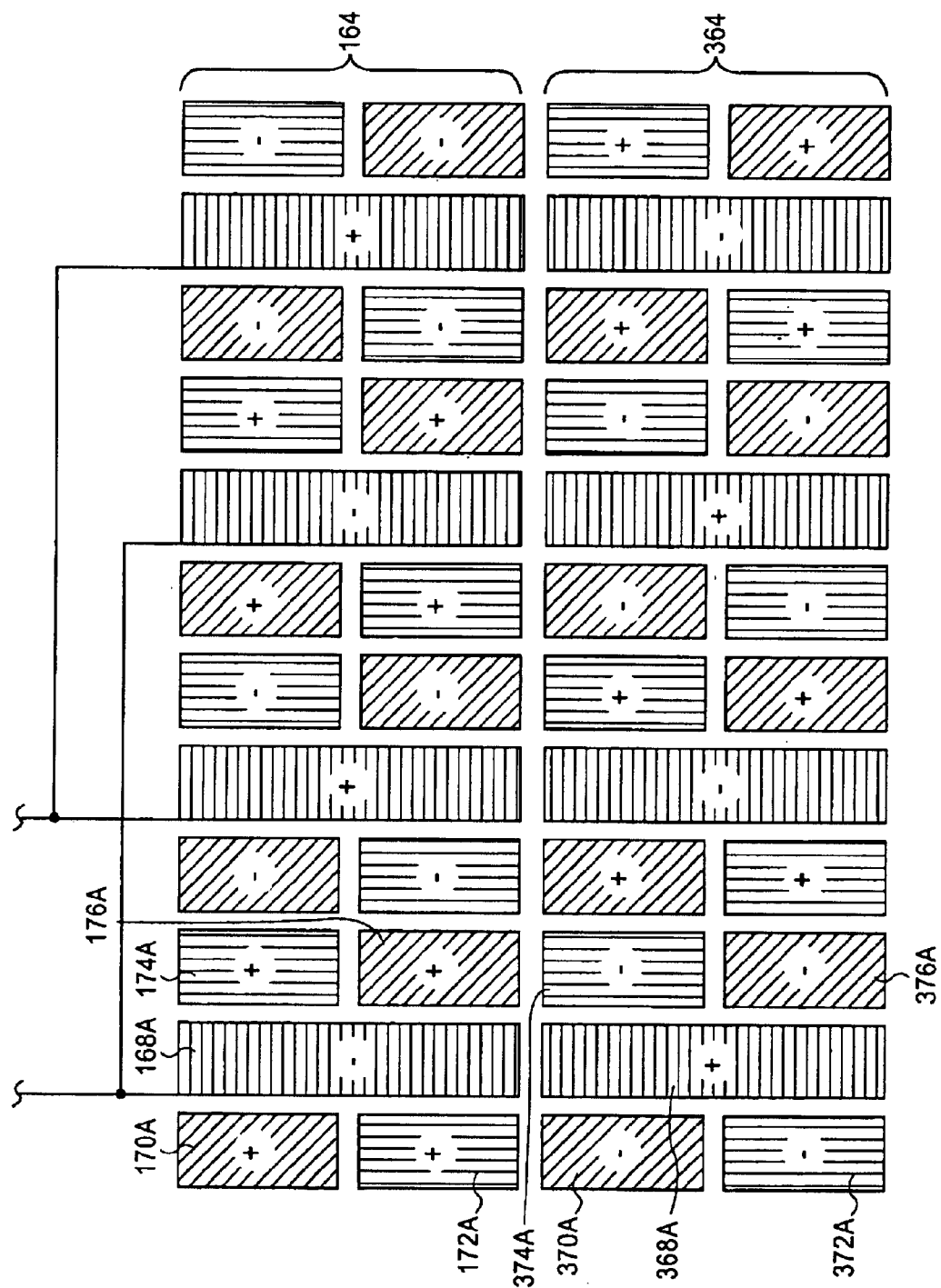
FIG. 18 is an alternate diagram for FIG. 17 also illustrating a dot inversion scheme for the pixel arrangement of FIG. 10.

In FIG. 18, an alternate dot inversion scheme is illustrated with horizontal arrangements 164, 264. Here, red emitters 170a, 176a and green emitters 172a, 174a (having positive values) must be driven by signals of an opposite polarity than the polarity of red emitters 370a, 376a and green emitters 372a, 374a (having negative values). The same applies for blue emitter 168a (having a negative value) and blue emitter 368a (having a positive value). This arrangement also eliminates "flicker" since the column lines connect a blue emitter with the blue emitter of its next nearest neighboring three-color pixel element.

Figure 19:
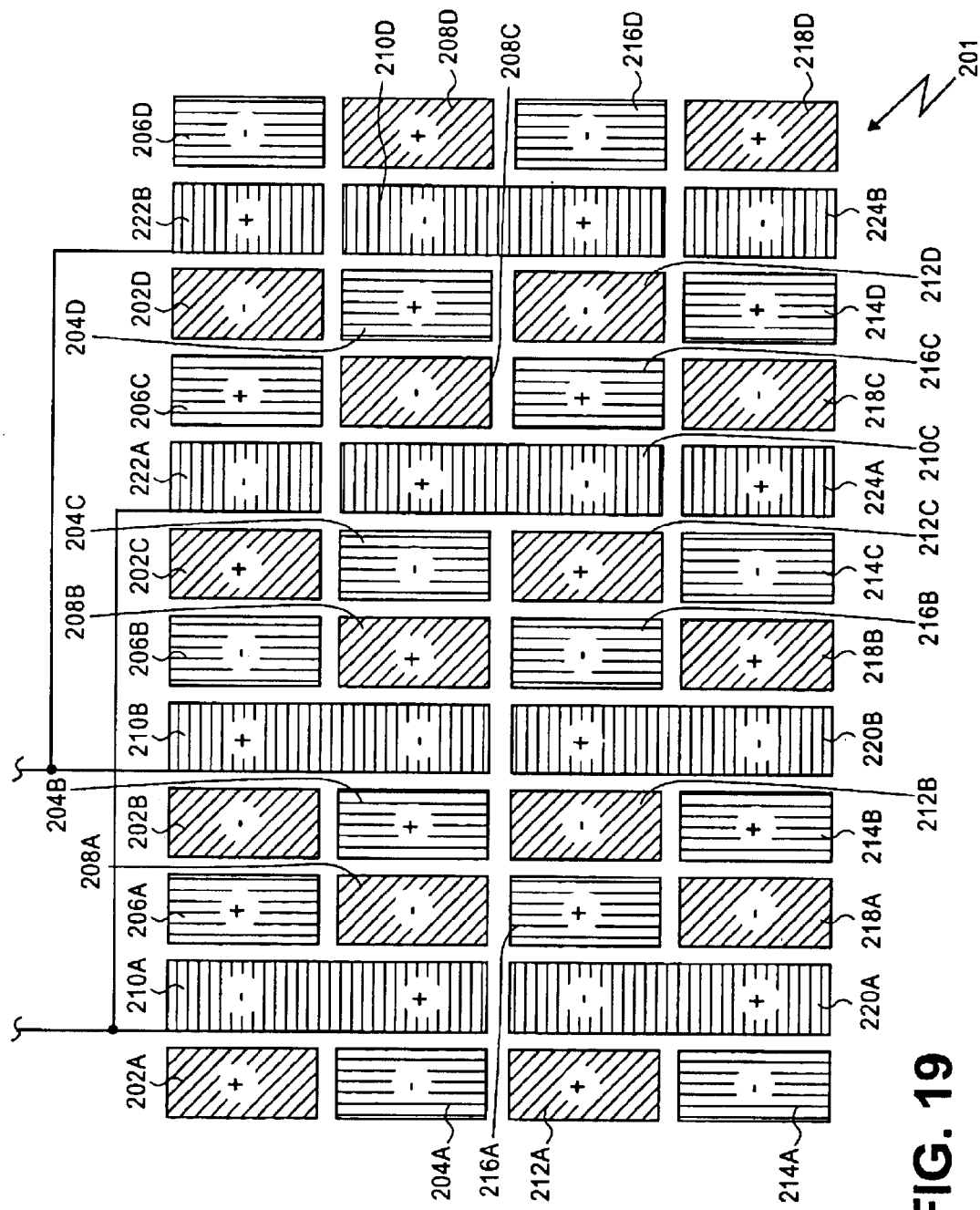
FIG. 19 is another diagram illustrating a dot inversion scheme for the pixel arrangement of FIG. 12.

Another example that illustrates dot inversion by the polarities of the red, green, and blue emitters is found in FIG. 19, which is based on the arrangement 201 illustrated in FIG. 12. Here, red emitter 202a and green emitter 206a (having positive values) and green emitter 204a and red emitter 208a (having negative values) must be driven be driven by signals of the same polarities as red emitter 212a and green emitter 216a (having positive values) and green emitter 214a and red emitter 2186a (having negative values), respectively. Blue emitter 210a (having a positive value with a stored negative value) must be driven by signals of an opposite polarity than blue emitter 220a (having a negative value with a stored positive value). Blue emitter 210c (having a positive value with a stored negative value) must be driven by signals of an opposite polarity than blue emitter 220c (having a negative value with a stored positive value). While blue emitters 222a and 224b must be driven by signals of an opposite polarity than blue emitters 222b and 224a. An individual skilled in the art will appreciate the polarities as described herein. This arrangement also eliminates "flicker" since the column lines connect a blue emitter with the blue emitter of its next nearest neighboring three-color pixel element.

Figure 20:
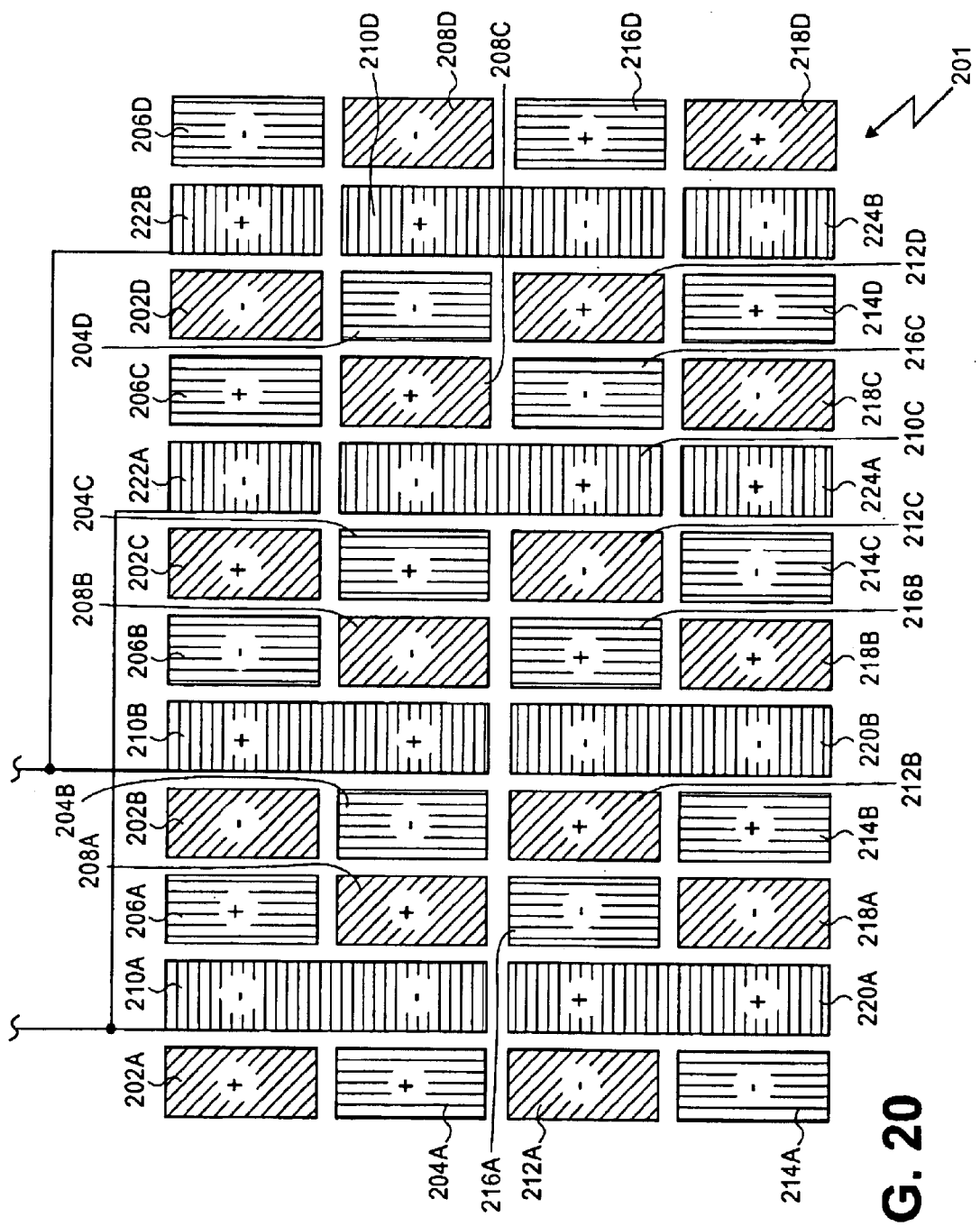
FIG. 20 is an alternate diagram for FIG. 19 also illustrating a dot inversion scheme for the pixel arrangement of FIG. 10.

In FIG. 20, an alternate dot inversion scheme is illustrated with horizontal arrangement 201. Here, red emitters 202a, 208a and green emitters 204a, 206a (having positive values) must be driven by signals of an opposite polarity than red emitters 212a, 218a and green emitters 214a, 216a (having negative values). The same applies for blue emitter 210a (having a negative value with a stored positive value) and blue emitter 220a (having a positive value with a stored negative value). Blue emitter 210c (having a negative value with a stored positive value) must be driven by signals of an opposite polarity than blue emitter 220c (having a positive value with a stored negative value). While blue emitters 222a and 224b must be driven by signals of an opposite polarity than blue emitters 222b and 224a. An individual skilled in the art will appreciate the polarities as described herein. This arrangement also eliminates "flicker" since the column lines connect a blue emitter with the blue emitter of its next nearest neighboring three-color pixel element.

The three-color pixel element, according to any of the above arrangements, can be operated by appropriately driving the individual emitters. A voltage is applied through each row and column driver to each individual row line and column line. At this point, each emitter is illuminated, according to the proper voltage, to create an image on the display.

By connecting the column lines of one blue emitter with the column line of the blue emitter from the next nearest neighboring three-color pixel element, "flicker" is virtually eliminated while at the same time enabling a reduction in column drivers.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:
1. An array for a display, comprising:
  a plurality of row positions and a plurality of column positions;
  a plurality of three-color pixel elements, one of said three-color pixel elements disposed in each of said row positions and said column positions, each of said three-color pixel elements comprising:
  a blue emitter disposed at a center of a square disposed at an origin of an X, Y coordinate system having a first, a second, a third, and a fourth quadrant, wherein said blue emitter is square-shaped;
  a pair of red emitters spaced apart from said blue emitter and symmetrically disposed about said blue emitter in said second and said fourth quadrants, wherein said red emitters occupy a portion of said second and said fourth quadrants not occupied by said blue emitter, wherein said red emitters are generally square-shaped having truncated inwardly-facing corners forming edges parallel to sides of said blue emitter;
  a pair of green emitters spaced apart from said blue emitter and symmetrically disposed about said blue emitter in said first and said third quadrants, wherein said green emitters occupy a portion of said first and said third quadrants not occupied by said blue emitter, wherein said green emitters are generally square-shaped having truncated inwardly-facing corners forming edges parallel to said sides of said blue emitter;
  a pair of row lines associated with each said row position in said array, a first of said row lines coupled to said red emitters and to said green emitters in said row position disposed above said origin of said coordinate system in each of said three-color pixel elements and coupled to said blue emitters of every even pair of adjacent said three-color pixel elements in said row position, and a second of said row lines coupled to said red emitters and to said green emitters in said row position disposed below said origin of said coordinate system in each of said three-color pixel elements, and coupled to said blue emitters of every odd pair of adjacent said three-color pixel elements in said row position; and three column lines associated with each said column position in said array, a first of said column lines coupled to said red emitters and to said green emitters in said column position disposed left of said origin of said rectangular coordinate system in each of said three-color pixel elements, a second of said column lines coupled to said blue emitter in said column position disposed at said origin of said rectangular coordinate system in each of said three-color pixel elements, and a third of said column lines coupled to said red emitters and to said green emitters in said column position disposed right of said origin of said rectangular coordinate system in each of said three-color pixel elements, wherein said second column line is coupled to said second column line of a next nearest neighboring said three-color pixel element.

2. The array of claim 1, wherein each said three-color pixel element in a row direction has a spatial frequency greater than a column direction.

3. The array of claim 1, wherein each said three-color pixel element in a column direction has a spatial frequency greater than in a row direction.

4. The array of claim 1, wherein each said row line coupled to each said red emitter, said green emitter, and said blue emitter is coupled to a gate of a select transistor.

5. The array of claim 1, wherein each said column line coupled to each said red emitter, said green emitter, and said blue emitter is coupled to a source/drain terminal of a select transistor.

6. The array of claim 1, wherein said array is driven by dot inversion.

7. An array for a display, comprising:

a plurality of row positions and a plurality of column positions;

a plurality of three-color pixel elements, one of said elements disposed in each of said row positions and said column positions, each of said three-color pixel elements comprising:

a blue emitter disposed at a center of a square disposed at an origin of an X, Y coordinate system having a first, a second, a third, and a fourth quadrant, wherein said blue emitter is square-shaped;

a pair of red emitters spaced apart from said blue emitter and symmetrically disposed about said blue emitter in said second and said fourth quadrants, wherein said red emitters occupy a portion of said second and said fourth quadrants not occupied by said blue emitter, wherein said red emitters are L-shaped;

a pair of green emitters spaced apart from said blue emitter and symmetrically disposed about said blue emitter in said first and said third quadrants, wherein said green emitters occupy a portion of said first and said third quadrants not occupied by said blue emitter, wherein said green emitters are L-shaped;

a pair of row lines associated with each said row position in said array, a first of said row lines coupled to said red emitters and to said green emitters in said row position disposed above said origin of said coordinate system in each of said three-color pixel elements and coupled to said blue emitters of every even pair of adjacent said three-color pixel elements in said row position, and a second of said row lines coupled to said red emitters and to said green emitters in said row position disposed below said origin of said coordinate system in each of said three-color pixel elements and coupled to said blue emitters of every odd pair of adjacent said three-color pixel elements in said row position; and three column lines associated with each said column position in said array, a first of said column lines coupled to said red emitters and to said green emitters in said column position disposed left of said center of said square in each of said three-color pixel elements, a second of said column lines coupled to said blue emitter in said column position disposed at said center of said square in each of said three-color pixel elements, and a third of said column lines coupled to said red emitters and to said green emitters in said column position disposed right of said center of said square in each of said three-color pixel elements, wherein said second column line is coupled to said second column line of a next nearest neighboring said three-color pixel element.

8. The array of claim 7, wherein each said three-color pixel element in a row direction has a spatial frequency greater than in a column direction.

9. The array of claim 7, wherein each said three-color pixel element in a column direction has a spatial frequency greater than in a row direction.

10. The array of claim 7, wherein each said row line coupled to each said red emitter, said green emitter, and said blue emitter is coupled to a gate of a select transistor.

11. The array of claim 7, wherein each said column line coupled to each said red emitter, said green emitter, and said blue emitter is coupled to a source/drain terminal of a select transistor.

12. The array of claim 7, wherein said array is driven by dot inversion.

13. An array of three-color pixel elements, comprising:

an array row comprising first, second, third, and fourth three-color pixel elements, each three-color pixel element comprising a blue emitter disposed at a center of a square disposed at an origin of an X, Y coordinate system having a first, a second, a third, and a fourth quadrant, wherein said blue emitter is square-shaped, a pair of red emitters spaced apart from said blue emitter and symmetrically disposed about said blue emitter in said second and said fourth quadrants, wherein said red emitters occupy a portion of said second and said fourth quadrants not occupied by said blue emitter, wherein said red emitters are generally square-shaped having truncated inwardly-facing corners forming edges parallel to sides of said blue emitter, and a pair of green emitters spaced apart from said blue emitter and symmetrically disposed about said blue emitter in said first and said third quadrants, wherein said green emitters occupy a portion of said first and said third quadrants not occupied by said blue emitter, wherein said green emitters are generally square-shaped having truncated inwardly-facing corners forming edges parallel to said sides of said blue emitter;

first and second row line drivers coupled to said array row;

a first row line coupled to said first row line driver, said first row line coupled to said blue emitter of said third and said fourth three-color pixel elements and to a first of said red emitters and a first of said green emitters of said first, second, third, and fourth three-color pixel elements;

a second row line coupled to said second row line driver, said second row line coupled to said blue emitter of said first and said second three-color pixel elements and to a second of said red emitters and a second of said green emitters of said first, second, third, and fourth three-color pixel elements;

first through tenth column line drivers coupled to said three-color pixel elements;

a first column line coupled to said first column line driver, said first column line coupled to said first red emitter and said second green emitter of said first three-color pixel element;

a second column line coupled to said second column line driver, said second column line coupled to said blue emitter of said first three-color pixel element and to an eighth column line coupled to said blue emitter of said third three-color pixel element;

a third column line coupled to said third column line driver, said third column line coupled to said second red emitter and said first green emitter of said first three-color pixel element;

a fourth column line coupled to said fourth column line driver, said fourth column line coupled to said first red emitter and said second green emitter of said second three-color pixel element;

a fifth column line coupled to said fifth column line driver, said fifth column line coupled to said blue emitter of said second three-color pixel element and to an eleventh column line coupled to said blue emitter of said fourth three-color pixel element;

a sixth column line coupled to said sixth column line driver, said sixth column line coupled to said second red emitter and said first green emitter of said second three-color pixel element:

a seventh column line coupled to said seventh column line driver, said seventh column line coupled to said first red emitter and said second green emitter of said third three-color pixel element;

a ninth column line coupled to said eighth column line driver, said ninth column line coupled to said second red emitter and said first green emitter of said fourth three-color pixel element;

a tenth column line coupled to said ninth column line driver, said tenth column line coupled to said first red emitter and said second green emitter of said fourth three-color pixel element; and a twelfth column line coupled to said tenth column line driver, said tenth column line coupled to said second red emitter and said first green emitter of said fourth three-color pixel element.

14. The array of claim 13, wherein said array is driven by dot inversion.

15. The array of claim 13, wherein each said row line coupled to each said red emitter, said green emitter, and said blue emitter is coupled to a gate of a select transistor.

16. The array of claim 13, wherein each said column line coupled to each said red emitter, said green emitter, and said blue emitter is coupled to a source/drain terminal of a select transistor.

17. The array of claim 13, further comprising another blue emitter in each said three-color pixel element.

18. An array of three-color pixel elements, comprising:

an array row comprising first, second, third, and fourth three-color pixel elements, each three-color pixel element comprising a blue emitter disposed at a center of a square disposed at an origin of an X, Y coordinate system having a first, a second, a third, and a fourth quadrant, wherein said blue emitter is square-shaped, a pair of red emitters spaced apart from said blue emitter and symmetrically disposed about said blue emitter in said second and said fourth quadrants, wherein said red emitters occupy a portion of said second and said fourth quadrants not occupied by said blue emitter, wherein said red emitters are L-shaped, and a pair of green emitters spaced apart from said blue emitter and symmetrically disposed about said blue emitter in said first and said third quadrants, wherein said green emitters occupy a portion of said first and said third quadrants not occupied by said blue emitter, wherein said green emitters are L-shaped;

first and second row line drivers coupled to said array row;

a first row line coupled to said first row line driver, said first row line coupled to said blue emitter of said third and said fourth three-color pixel element and to a first of said red emitters and a first of said green emitters of said first, second, third, and fourth three-color pixel elements;

a second row line coupled to said second row line driver, said second row line coupled to said blue emitter of said first and said second three-color pixel element and to a second of said red emitters and a second of said green emitters of said first, second, third, and fourth three-color pixel elements;

first through tenth column line drivers coupled to said three-color pixel element;

a first column line coupled to said first column line driver, said first column line coupled to said first red emitter and said second green emitter of said first three-color pixel element;

a second column line coupled to said second column line driver, said second column line coupled to said blue emitter of said first three-color pixel element and to an eighth column line coupled to said blue emitter of said third three-color pixel element;

a third column line coupled to said third column line driver, said third column line coupled to said second red emitter and said first green emitter of said first three-color pixel element;

a fourth column line coupled to said fourth column line driver, said fourth column line coupled to said first red emitter and said second green emitter of said second three-color pixel element;

a fifth column line coupled to said fifth column line driver, said fifth column line coupled to said blue emitter of said second three-color pixel element and to an eleventh column line coupled to said blue emitter of said fourth three-color pixel element;

a sixth column line coupled to said sixth column line driver, said sixth column line coupled to said second red emitter and said first green emitter of said second three-color pixel element;

a seventh column line coupled to said seventh column line driver, said seventh column line coupled to said first red emitter and said second green emitter of said third three-color pixel element;

a ninth column line coupled to said eighth column line driver, said ninth column line coupled to said second red emitter and said first green emitter of said fourth three-color pixel element;

a tenth column line coupled to said ninth column line driver, said tenth column line coupled to said first red emitter and said second green emitter of said fourth three-color pixel element; and a twelfth column line coupled to said tenth column line driver, said tenth column line coupled to said second red emitter and said first green emitter of said fourth three-color pixel element.

19. The array of claim 18, wherein said array is driven by dot inversion.

20. The array of claim 18, wherein each said row line coupled to each said red emitter, said green emitter, and said blue emitter is coupled to a gate of a select transistor.

21. The array of claim 18, wherein each said column line coupled to each said red emitter, said green emitter, and said blue emitter is coupled to a source/drain terminal of a select transistor.

22. The array of claim 18, further comprising another blue emitter in each said three-color pixel element.

23. An array for a display, comprising:

a plurality of array row positions and a plurality of column positions;

a plurality of three-color pixel elements, one of said three-color pixel elements disposed in each of said row positions and said column positions, each of said three-color pixel elements comprising:

first and second pixel rows, each pixel row including three unit-area polygons, wherein an emitter occupies each said unit-area polygon, wherein a red emitter occupies a left unit-area polygon in said first pixel row and a green emitter occupies a right unit-area polygon in said first pixel row, wherein a green emitter occupies a left unit-area polygon in said second pixel row and a red emitter occupies a right unit-area polygon in said second pixel row, and wherein a blue emitter occupies a center unit-area polygon in both said first and said second pixel rows;

a plurality of row lines associated with each said row position in said array, a first of said row lines coupled to said blue emitter in said first pixel row, to said red emitters in said first pixel row and to said green emitters in said first pixel row in each of said three-color pixel elements in said array row position, wherein said first of said row lines is coupled to said blue emitters in said first pixel row of every even pair of adjacent said three-color pixel elements, and a second of said row lines coupled to said blue emitter in said second pixel row, to said red emitters in said second pixel row, and to said green emitters in said second pixel row in each of said three-color pixel elements in said array row position, wherein said second of said row lines is coupled to said blue emitters in said second row of every odd pair of adjacent said three-color pixel elements; and a plurality of column lines associated with each said column position, a first of said column lines coupled to said red emitters and to said green emitters in said column position disposed left of said blue emitters in each of said three-color pixel elements, a second of said column lines coupled to said blue emitters in said column position disposed at said center of square in each of said three-color pixel elements, and a third of said column lines coupled to said red emitters and to said green emitters in said column position disposed right of said blue emitters in each of said three-color pixel elements, wherein said second column line is coupled to said second column line of a next nearest neighboring said three-color pixel element.

24. The array of claim 23, wherein each said three-color pixel element in a row direction has a spatial frequency greater than in a column direction.

25. The array of claim 23, wherein each said three-color pixel element in a column direction has a spatial frequency greater than in a row direction.

26. The array of claim 23, wherein each said row line coupled to each said red emitter, said green emitter, and said blue emitter is coupled to a gate of a select transistor.

27. The array of claim 23, wherein each said column line coupled to each said red emitter, said green emitter, and said blue emitter is coupled to a source/drain terminal of a select transistor.

28. The array of claim 23, wherein said array is driven by dot inversion.

29. The array of claim 23, wherein said green emitter occupies said left unit-area polygon in said first pixel row and said red emitter occupies said right unit-area polygon in said first pixel row; and wherein said red emitter occupies said left unit-area polygon in said second pixel row and said green emitter occupies said right unit-area polygon in said second pixel row.

30. The array of claim 23, wherein said unit-area polygon is a square.

31. The array of claim 23, wherein said unit-area polygon is a rectangle.

32. The array of claim 23, wherein said blue emitters occupying said center unit-area polygon in both said first and said second pixel rows are wired together.

33. An array of three-color pixel elements, comprising:

an array row comprising first, second, third, and fourth three-color pixel elements, each said three-color pixel element comprising first and second pixel rows, each pixel row including three unit-area polygons, wherein an emitter occupies each said unit-area polygon, wherein a red emitter occupies a left unit-area polygon in said first pixel row and a green emitter occupies a right unit-area polygon in said first pixel row, wherein a green emitter occupies a left unit-area polygon in said second pixel row and a red emitter occupies a right unit-area polygon in said second pixel row, and wherein a blue emitter occupies a center unit-area polygon in both said first and said second pixel rows;

first and second row line drivers coupled to said array row;

a first row line coupled to said first row line driver, said first row line coupled to said blue emitters in said first pixel row of said third and said fourth three-color pixel element and to said red emitter and said green emitter in said first pixel row of said first, second, third, and fourth three-color pixel elements;

a second row line coupled to said second row line driver, said second row line coupled to said blue emitters in said second pixel row of said first and said second three-color pixel element and to said red emitter and said green emitter in said second pixel row of said first, second, third, and fourth three-color pixel elements;

first through tenth column line drivers coupled to said three-color pixel elements;

a first column line coupled to said first column line driver, said first column line coupled to said red emitter in said first pixel row and said green emitter in said first pixel row of said first three-color pixel element;

a second column line coupled to said second column line driver, said second column line coupled to said blue emitters of said first three-color pixel element and to an eighth column line coupled to said blue emitters of said third three-color pixel element;

a third column line coupled to said third column line driver, said third column line coupled to said red emitter in said second pixel row and said green emitter in said first pixel row of said first three-color pixel element;

a fourth column line coupled to said fourth column line driver, said fourth column line coupled to said red emitter in said first pixel row and said green emitter in said second pixel row of said second three-color pixel element;

a fifth column line coupled to said fifth column line driver, said fifth column line coupled to said blue emitters of said second three-color pixel element and to an eleventh column line coupled to said blue emitters of said fourth three-color pixel element;

a sixth column line coupled to said sixth column line driver, said sixth column line coupled to said red emitter in said second pixel row and said green emitter in said first pixel row of said second three-color pixel element;

a seventh column line coupled to said seventh column line driver, said seventh column line coupled to said red emitter in said first pixel row and said green emitter in said second pixel row of said third three-color pixel element;

a ninth column line coupled to said eighth column line driver, said ninth column line coupled to said red emitter in said second pixel row and said green emitter in said first pixel row of said fourth three-color pixel element;

a tenth column line coupled to said ninth column line driver, said tenth column line coupled to said red emitter in said first pixel row and said green emitter in said second pixel row of said fourth three-color pixel element; and a twelfth column line coupled to said tenth column line driver, said tenth column line coupled to said second red emitter and said first green emitter of said fourth three-color pixel element.

34. The array of claim 33, wherein said array is driven by dot inversion.

35. The array of claim 33, wherein each said row line coupled to each said red emitter, said green emitter, and said blue emitter is coupled to a gate of a select transistor.

36. The array of claim 33, wherein each said column line coupled to each said red emitter, said green emitter, and said blue emitter is coupled to a source/drain terminal of a select transistor.

37. The array of claim 33, wherein said green emitter occupies said left unit-area polygon in said first row and said red emitter occupies said right unit-area polygon in said first row; and wherein said red emitter occupies said left unit-area polygon in said first row and said green emitter occupies said right unit-area polygon in said first row.

38. The array of claim 33, wherein said unit-area polygon is a square.

39. The array of claim 33, wherein said unit-area polygon is a rectangle.

40. The array of claim 33, wherein said blue emitters occupying said center unit-area polygon in both said first and said second rows are wired together.

41. An array for a display, comprising:

a plurality of array row positions and a plurality of column positions;

a plurality of three-color pixel elements, one of said three-color pixel elements disposed in each of said row positions and said column positions, each of said three-color pixel elements comprising:

first and second pixel rows, each pixel row including three unit-area polygons, wherein an emitter occupies each said unit-area polygon, wherein a red emitter occupies a left unit-area polygon in said first pixel row and a green emitter occupies a right unit-area polygon in said first pixel row; wherein a green emitter occupies a left unit-area polygon in said second pixel row and a red emitter occupies a right unit-area polygon in said second pixel row; and wherein a single blue emitter occupies both center unit-area polygons in said first and said second pixel rows;

a plurality of row lines associated with each said row position in said array, a first of said row lines coupled to said blue emitter, to said red emitters, and to said green emitters in said first pixel row in each of said three-color pixel elements in said array row position, wherein said first of said row lines is coupled to said blue emitters of every even pair of adjacent said three-color pixel elements, and a second of said row lines coupled to said blue emitter, to said red emitters, and to said green emitters in said second pixel row in each of said three-color pixel elements in said array row position, wherein said second of said row lines is coupled to said blue emitters of every odd pair of adjacent said three-color pixel elements; and a plurality of column lines associated with each said column position in said array, a first of said column lines coupled to said red emitters and to said green emitters in said column position disposed left of said blue emitter in each of said three-color pixel elements, a second of said column lines coupled to said blue emitter in said column position in each of said three-color pixel elements, and a third of said column lines coupled to said red emitters and to said green emitters in said column position disposed right of said blue emitter in each of said three-color pixel elements, wherein said second column line is coupled to said second column line of a next nearest neighboring said three-color pixel element.

42. The array of claim 41, wherein each said three-color pixel element in a row direction has a spatial frequency greater than in a column direction.

43. The array of claim 41, wherein each said three-color pixel element in a column direction has a spatial frequency greater than in a row direction.

44. The array of claim 41, wherein each said row line coupled to each said red emitter, said green emitter, and said blue emitter is coupled to a gate of a select transistor.

45. The array of claim 41, wherein each said column line coupled to each said red emitter, said green emitter, and said blue emitter is coupled to a source/drain terminal of a select transistor.

46. The array of claim 41, wherein said array is driven by dot inversion.

47. The array of claim 41, wherein said green emitter occupies said left unit-area polygon in said first pixel row and said red emitter occupies said right unit-area polygon in said first pixel row; and wherein said red emitter occupies said left unit-area polygon in said second pixel row and said green emitter occupies said right unit-area polygon in said second pixel row.

48. The array of claim 41, wherein said unit-area polygon is a square.

49. The array of claim 41, wherein said unit-area polygon is a rectangle.

50. An array of three-color pixel elements, comprising:
an array row comprising first, second, third, and fourth three-color pixel elements, each three-color pixel element comprising first and second pixel rows, each pixel row including three unit-area polygons, wherein an emitter occupies each said unit-area polygon, wherein a red emitter occupies a left unit-area polygon in said first pixel row and a green emitter occupies a right unit-area polygon in said first pixel row, wherein a green emitter occupies a left unit-area polygon in said second pixel row and a red emitter occupies a right unit-area polygon in said second pixel row; and wherein a single blue emitter occupies both center unit-area polygons in said first and said second pixel rows;
first and second row line drivers coupled to said array row;
a first row line coupled to said first row line driver, said first row line coupled to said blue emitters of said third and said fourth three-color pixel element and to said red emitter and said green emitter in said first pixel row of said first, second, third, end fourth three-color pixel elements;
a second row line coupled to said second row line driver, said second row line coupled to said blue emitters of said first and said second three-color pixel element and to said red emitter and said green emitter in said second pixel row of said first, second, third, and fourth three-color pixel elements;
first through tenth column line drivers coupled to said three-color pixel elements;
a first column line coupled to said first column line driver, said first column line coupled to said red emitter in said first pixel row and said green emitter in said second pixel row of said first three-color pixel element;
a second column line coupled to said second column line driver, said second column line coupled to said blue emitter of said first three-color pixel element and to an eighth column line coupled to said blue emitter of said third three-color pixel element;
a third column line coupled to said third column line driver, said third column line coupled to said red emitter in said second pixel row and said green emitter in said first pixel row of said first three-color pixel element;
a fourth column line coupled to said fourth column line driver, said fourth column line coupled to said red emitter in said first pixel row and said green emitter in said second pixel row of said second three-color pixel element;
a fifth column line coupled to said fifth column line driver, said fifth column line coupled to said blue emitter of said second three-color pixel element and to an eleventh column line coupled to said blue emitter of said fourth three-color pixel element;
a sixth column line coupled to said sixth column line driver, said sixth column line coupled to said red emitter in said second pixel row and said green emitter in said first pixel row of said second three-color pixel element;
a seventh column line coupled to said seventh column line driver, said seventh column line coupled to said red emitter in said first pixel row and said green emitter in said second pixel row of said third three-color pixel element;
a ninth column line coupled to said eighth column line driver, said ninth column line coupled to said red emitter in said second pixel row and said green emitter in said first pixel row of said fourth three-color pixel element;
a tenth column line coupled to said ninth column line driver, said tenth column line coupled to said red emitter in said first pixel row and said green emitter in said second pixel row of said fourth three-color pixel element; and
a twelfth column line coupled to said tenth column line driver, said tenth column line coupled to said red emitter in said second pixel row and said green emitter in said first pixel row of said fourth three-color pixel element.

51. The array of claim 50, wherein said array is driven by dot inversion.

52. The array of claim 50, wherein each said row line coupled to each said red emitter, said green emitter, and said blue emitter is coupled to a gate of a select transistor.

53. The array of claim 50, wherein each said column line coupled to each said red emitter, said green emitter, and said blue emitter is coupled to a source/drain terminal of a select transistor.

54. The array of claim 50, wherein said green emitter occupies said left unit-area polygon in said first pixel row and said red emitter occupies said right unit-area polygon in said first pixel row; and wherein said red emitter occupies said left unit-area polygon in said second pixel row and said green emitter occupies said right unit-area polygon in said second pixel row.

55. The array of claim 50, wherein said unit-area polygon is a square.

56. The array of claim 50, wherein said unit-area polygon is a rectangle.

57. An array for a display, comprising:
a plurality of array row positions and a plurality of column positions;
a plurality of three-color pixel elements, one of said three-color pixel elements disposed in each of said array row positions and said column positions, wherein each of said three-color pixel elements comprises:
first and second pixel rows, each row including three unit-area polygons, wherein an emitter occupies each said unit-area polygon, wherein a red emitter occupies a left unit-area polygon in said first pixel row and a green emitter occupies a right unit-area polygon in said first pixel row; wherein a green emitter occupies a left unit-area polygon in said first pixel row and a red emitter occupies a right unit-area polygon in said first pixel row; and wherein a single blue emitter occupies both center unit-area polygons in said first and said second pixel rows;
wherein adjacent horizontal pairs of said three-color pixel elements are vertically offset from one another by one said pixel row;
a plurality of row lines associated with each said array row position,
wherein a first of said row lines is coupled to all said red and said green emitters in said first pixel row of each odd pair of said three-color pixel elements in each said array row position and to all said red and said green emitters in said second pixel row of each even pair of said three-color pixel elements in each said array row position, wherein said first of said row lines is coupled to said blue emitters of every odd pair of adjacent said three-color pixel elements;

wherein a second of said row lines is coupled to all said red and said green emitters in said second pixel row of each odd pair of said three-color pixel elements in each said array row position and to all said red and said green emitters in said first pixel row of each even pair of said three-color pixel elements in each said array row position, wherein said first of said row lines is coupled to said blue emitters of every even pair of adjacent said three-color pixel elements; and a plurality of column lines associated with each said column position in said array;

wherein a first, a fourth, a seventh, and a tenth of said column lines is coupled to said red emitters and to said green emitters in said column position disposed left of said blue emitter in each of said three-color pixel elements;

wherein a second, a fifth, an eight, and an eleventh of said column lines is coupled to said blue emitter in said column position in each of said three-color pixel elements, wherein said second of said column lines is coupled to said eighth of said column lines and wherein said fifth of said column lines is coupled to said eleventh of said column lines; and wherein a third, a sixth, a ninth, and a twelfth of said column lines is coupled to said red emitters and to said green emitters in said column position disposed right of said blue emitter in each of said three-color pixel elements.

58. The array of claim 57, wherein each said three-color pixel element in a row direction has a spatial frequency greater than in a column direction.

59. The array of claim 57, wherein each said three-color pixel element in a column direction has a spatial frequency greater than in a row direction.

60. The array of claim 57, wherein each said row line coupled to each said red emitter, said green emitter, and said blue emitter is coupled to a gate of a select transistor.

61. The array of claim 57, wherein each said column line coupled to each said red emitter, said green emitter, and said blue emitter is coupled to a source/drain terminal of a select transistor.

62. The array of claim 57, wherein said array is driven by dot inversion.

63. The array of claim 57, wherein said green emitter occupies said left unit-area polygon in said first pixel row and said red emitter occupies said right unit-area polygon in said first pixel row; and wherein said red emitter occupies said left unit-area polygon in said second pixel row and said green emitter occupies said right unit-area polygon in said second pixel row.

64. The array of claim 57, wherein said unit-area polygon is a square.

65. The array of claim 57, wherein said unit-area polygon is a rectangle.

66. An array of three-color pixel elements, comprising:

a plurality of array rows and a plurality of array columns containing three-color pixel elements each said three-color pixel element comprising first and second pixel rows, each pixel row including three unit-area polygons, wherein an emitter occupies each said unit-area polygon, wherein a red emitter occupies a left unit-area polygon in said first pixel row and a green emitter occupies a right unit-area polygon in said first pixel row; wherein a green emitter occupies a left unit-area polygon in said second pixel row and a red emitter occupies a right unit-area polygon in said second pixel row; and wherein a single blue emitter occupies both center unit-area polygons in said first and said second pixel rows;

wherein adjacent horizontal pairs of said three-color pixel elements are vertically offset from one another by one said pixel row;

first and second row line drivers coupled to said array row;

a first row line coupled to said first row line driver, wherein said first row line is coupled to all said red and said green emitters in said first pixel row of each odd pair of said three-color pixel elements in each said array row position and to all said red and said green emitters in said second pixel row of each even pair of said three-color pixel elements in each said array row position, wherein said first of said row lines is coupled to said blue emitters of every odd pair of adjacent said three-color pixel elements;

a second row line coupled to said second row line driver, wherein said second row line is coupled to all said red and said green emitters in said second pixel row of each odd pair of said three-color pixel elements in each said array row position and to all said red and said green emitters in said first pixel row of each even pair of said three-color pixel elements in each said array row position, wherein said first of said row lines is coupled to said blue emitters of every even pair of adjacent said three-color pixel elements; and first through tenth column line drivers coupled to said three-color pixel elements;

a first column line coupled to said first column line driver, said first column line coupled to all left-most emitters of every said three-color pixel element in a first of said array columns;

a second column line coupled to said second column line driver, said second column line coupled to all center emitters of every said three-color pixel element in a second of said array columns and to an eighth column line coupled to all center emitters of every said three-color pixel element in an eighth of said array columns;

a third column line coupled to said third column line driver, said third column line coupled to all right-most emitters of every said three-color pixel element in a third of said array columns;

a fourth column line coupled to said fourth column line driver, said fourth column line coupled to all left-most emitters of every said three-color pixel element in a fourth of said array columns;

a fifth column line coupled to said fifth column line driver, said fifth column line coupled to all center emitters of every said three-color pixel element in a fifth of said array columns and to an eleventh column line coupled to all center emitters of every said three-color pixel element in an eleventh of said array columns;

a sixth column line coupled to said sixth column line driver, said sixth column line coupled to all right-most emitters of every said three-color pixel element in a sixth of said array columns;

a seventh column line coupled to said seventh column line driver, said seventh column line coupled to all left-most emitters of every said three-color pixel element in a seventh of said array columns;

a ninth column line coupled to said eighth column line driver, said ninth column line coupled to all right-most emitters of every said three-color pixel element in a ninth of said array columns;

a tenth column line coupled to said ninth column line driver, said tenth column line coupled to all left-most emitters of every said three-color pixel element in a tenth of said array columns; and a twelfth column line coupled to said tenth column line driver, said twelfth column line coupled to all right-most emitters of every said three-color pixel element in a twelfth of said array columns.

67. The array of claim 66, wherein said array is driven by dot inversion.

68. The array of claim 66, wherein each said row line coupled to each said red emitter, said green emitter, and said blue emitter is coupled to a gate of a select transistor.

69. The array of claim 66, wherein each said column line coupled to each said red emitter, said green emitter, and said blue emitter is coupled to a source/drain terminal of a select transistor.

70. The array of claim 66, wherein said green emitter occupies said left unit-area polygon in said first pixel row and said red emitter occupies said right unit-area polygon in said first pixel; row and wherein said red emitter occupies said left unit-area polygon in said second pixel row and said green emitter occupies said right unit-area polygon in said second pixel row.

71. The array of claim 66, wherein said unit-area polygon is a square.

72. The array of claim 66, wherein said unit-area polygon is a rectangle.

* * * * *